(12) United States Patent
Yano et al.

(10) Patent No.: US 8,547,470 B2
(45) Date of Patent: Oct. 1, 2013

(54) OPTICAL ELEMENT, OPTICAL ELEMENT WAFER, OPTICAL ELEMENT WAFER MODULE, OPTICAL ELEMENT MODULE, METHOD FOR MANUFACTURING OPTICAL ELEMENT MODULE, ELECTRONIC ELEMENT WAFER MODULE, METHOD FOR MANUFACTURING ELECTRONIC ELEMENT MODULE, ELECTRONIC ELEMENT MODULE AND ELECTRONIC INFORMATION DEVICE

(75) Inventors: Yuji Yano, Osaka (JP); Kenji Hirano, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 278 days.

(21) Appl. No.: 12/586,624

(22) Filed: Sep. 23, 2009

(65) Prior Publication Data

US 2010/0073534 A1    Mar. 25, 2010

(30) Foreign Application Priority Data

Sep. 25, 2008  (JP) .................................. 2008-246968
Aug. 28, 2009  (JP) .................................. 2009-199049

(51) Int. Cl.
*H04N 5/225*    (2006.01)

(52) U.S. Cl.
USPC ......................................... 348/340; 348/335

(58) Field of Classification Search
USPC .................... 348/340, 294, 335; 438/68, 69; 359/503, 601, 811; 156/256
See application file for complete search history.

(56) References Cited

U.S. PATENT DOCUMENTS

| | | | | |
|---|---|---|---|---|
| 6,072,634 A | * | 6/2000 | Broome et al. | 359/637 |
| 7,088,530 B1 | * | 8/2006 | Recco et al. | 359/811 |
| 7,564,496 B2 | * | 7/2009 | Wolterink et al. | 348/340 |
| 8,013,289 B2 | * | 9/2011 | Chang et al. | 250/239 |
| 2004/0169763 A1 | * | 9/2004 | Ikeda | 348/340 |
| 2006/0043262 A1 | * | 3/2006 | Akram | 250/208.1 |
| 2009/0047011 A1 | * | 2/2009 | Okamoto et al. | 359/819 |

FOREIGN PATENT DOCUMENTS

| | | | |
|---|---|---|---|
| JP | 2003-203374 | * | 7/2003 |
| JP | 2004-063751 A | | 2/2004 |
| JP | 2005-317745 | * | 11/2005 |
| WO | WO-2005/057264 A1 | | 6/2005 |

OTHER PUBLICATIONS

Chinese Office Action mailed Jun. 26, 2012 in corresponding Chinese Patent Application No. 200910176293.8. (Including English Translation).

* cited by examiner

*Primary Examiner* — Nhan T Tran
(74) *Attorney, Agent, or Firm* — Edwards Wildman Palmer LLP; George W. Nenner

(57) ABSTRACT

An optical element according to the present invention includes: an optical surface at a center portion thereof; and a spacer section having a predetermined thickness on an outer circumference side of the optical surface, wherein a bottom portion for positioning an adhesive is provided on a further outer circumference side of the spacer section with a tapered portion interposed therebetween.

17 Claims, 29 Drawing Sheets

*Prior Art*

*Prior Art*

*Prior Art*

*Prior Art*

*Prior Art*

OPTICAL ELEMENT, OPTICAL ELEMENT WAFER, OPTICAL ELEMENT WAFER MODULE, OPTICAL ELEMENT MODULE, METHOD FOR MANUFACTURING OPTICAL ELEMENT MODULE, ELECTRONIC ELEMENT WAFER MODULE, METHOD FOR MANUFACTURING ELECTRONIC ELEMENT MODULE, ELECTRONIC ELEMENT MODULE AND ELECTRONIC INFORMATION DEVICE

This nonprovisional application claims priority under 35 U.S.C. §119(a) to Patent Applications No. 2008-246968 filed in Japan on Sep. 25, 2008, and No. 2009-199049 filed in Japan on Aug. 28, 2009, the entire contents of which are hereby incorporated by reference.

BACKGROUND OF THE INVENTION

1. Field of the Invention

The present invention is related to an optical element provided with a lens and an optical function element. Further, the present invention is related to an optical element wafer provided with a plurality of optical elements, such as a plurality of lenses and a plurality of optical function elements, in a wafer state. Further, the present invention is related to an optical element wafer module in which the plurality of optical element wafers are laminated. Further, the present invention is related to an optical element module, which is made by cutting the optical element wafer or the optical element wafer module, and a method for manufacturing the optical element module. Further, the present invention is related to an electronic element wafer module in which the optical element wafer or optical element wafer module is modularized with an electronic element wafer. Further, the present invention is related to a method for manufacturing an electronic element module, in which the electronic element wafer module is cut simultaneously or the optical element or the optical element module is modularized with an electronic element. Further, the present invention is related to an electronic element module manufactured by the method for manufacturing the electronic element module. Further, the present invention is related to an electronic information device, such as a digital camera (e.g., a digital video camera or a digital still camera), an image input camera, a scanner, a facsimile machine, a camera-equipped cell phone device and a television telephone device, including the electronic element module used therein.

2. Description of the Related Art

Further downsizing and lowering the cost are requested for a camera-equipped cell phone device and a personal digital assistant (PDA) and so on as conventional optical devices that include an image capturing element and a light-focusing lens element thereabove.

In response to such a request, Reference 1 proposes a method for obtaining an image capturing element module, the method including the steps of: forming and connecting an image capturing element for performing a photoelectric conversion on and capturing an image of incident light and a lens element thereabove for focusing light at a wafer level; modularizing the image capturing element and the lens element as an image capturing element wafer module, which functions as an electronic element wafer module; and individualizing the modularized image capturing element wafer module by simultaneous cutting. According to the method, a transparent substrate is adhered above a semiconductor wafer having an image capturing element at the center portion, with a spacer interposed therebetween. A convex lens is formed as a light-focusing lens element on the transparent substrate in a closely-adhered manner. This image capturing element module will be described in detail with reference to FIG. 28.

FIG. 28 is an essential part longitudinal cross sectional view illustrating one exemplary structure of a conventional image capturing element wafer module at a time of simultaneous cutting.

In FIG. 28, a conventional image capturing element wafer module 100 includes: an image capturing element wafer 102, in which a plurality of image capturing elements 101 are arranged in a matrix, the image capturing elements 101 including a plurality of light receiving sections for performing a photoelectric conversion on and capturing an image of image light from a subject; a resin adhesion layer 103 formed on the image capturing element wafer 102 and in between the image capturing elements 101; a transparent substrate 104 covering the image capturing element wafer 102 and adhered and fixed on the resin adhesion layer 103; and lens elements 105 provided on the transparent substrate 104 in such a manner to correspond to the plurality of image capturing elements 101 respectively. In addition, a cut-securing tape 106, which is adhered on a back surface side during cutting, is adhered on a convex lens surface of the lens element 105. Maintaining this state, the image capturing element wafer module 100 is simultaneously cut along dicing lines DL between adjacent image capturing elements 101.

According to Reference 1, as illustrated in FIG. 29, a camera device 200 includes: a cover plate 203 provided above an image capturing element 201 with a minute spacer plate 202 interposed therebetween; and a lens plate 205 provided above the cover plate 203 such that the center of the image capturing element 201 corresponds to an optical axis C of a protruded lens 204. In this case, a cut-securing tape, which is adhered on a back surface side during cutting, is adhered on a convex lens surface of the lens 204, and the camera device 200 is cut simultaneously along dicing lines DL between adjacent image capturing elements 201.

Furthermore, Reference 2 discloses an example where a lens is formed in each of a plurality of through holes of a lens substrate. It is conceived that a plurality of such lens wafer modules are laminated on an image capturing element wafer to be modularized. FIG. 30 illustrates this module.

FIG. 30 illustrates a lens wafer disclosed in Reference 2, and is an essential part longitudinal cross sectional view illustrating an image capturing wafer module, in which a plurality of lens wafers are used with lenses provided in a plurality of through holes of a lens substrate and the lens wafers are modularized with an image capturing element wafer.

In FIG. 30, an image capturing element wafer module 250 includes: an image capturing element wafer 252, in which a plurality of image capturing elements 251 are arranged in a matrix, the image capturing elements 251 including a plurality of light receiving sections for performing a photoelectric conversion on and capturing an image of image light from a subject; and a transparent support substrate 254 with a resin adhesion layer 253 interposed therebetween, part of which is removed above the image capturing element 251. A lens wafer module 255 is provided being adhered on the transparent support substrate 254, the lens wafer module 255 being provided such that each lens position corresponds to each of the plurality of image capturing elements 251. The lens wafer module 255 is provided with a lens substrate 256 in such a manner to fill an outer circumference area of a lens, and a lens wafer 255a is configured to be adhered on a lens wafer 255b by an adhesive 257 herein. In addition, on a front surface side of the lens wafer 255a, a light shielding plate 258 with an opening (hole) on an optical surface A is provided by being adhered by the adhesive 257. Further, the transparent support substrate 254 is adhered with the lens wafer 255b by the adhesive 257. The adhesive 257 is provided in an area having a predetermined width on an outer circumference side of the openings of the light shielding plate and the lens substrate 256 as well as along each side inside of square or rectangular dicing lines DL on the outer circumference side of the circular optical surface A at the center, when viewing the image capturing element wafer module 250 of FIG. 31, as illustrated in FIG. 30.

The image capturing element wafer module 250 is illustrated in FIG. 30 with a unitary module cross-sectional structure; however, a large number of the unitary module cross-sectional structures are arranged in a matrix of row and column directions. The unitary module cross-sectional structure is an image capturing element module after the individualizing along the dicing lines DL.

In References 3 as illustrated in FIG. 32, an object lens 300 includes: a substrate 302 with a first lens 301 formed therein; a substrate 304 with a second lens 303 formed therein; and an adhesive 305 for adhering and fixing the substrates 302 and 304 with the first lens 301 and the second lens 303, the substrates facing the respective lenses. A light-absorbing heating element 306 is formed in the outer periphery of the substrate 302, a light-absorbing heating element 307 is formed on the outer circumference side of the first lens 301 and inside the substrate 302, a light-absorbing heating element 308 is formed on the outer circumference side of the second lens 303 and inside the substrate 304, and a light-absorbing heating element 309 is formed in the outer periphery of the substrate 304, each of which is formed at a position not shielding each optical path of the first and second lenses 301 and 303. The first lens 301 and the second lens 303 are provided facing with each other with respective optical axes aligned in a space portion 310 between the substrates 302 and 304.

Reference 1: Japanese Laid-Open Publication No. 2004-63751

Reference 2: Japanese Laid-Open Publication No. 2005-539276

Reference 3: Japanese Laid-Open Publication No. 2003-203374

SUMMARY OF THE INVENTION

According to the structures of the inventions of References 1 and 2, when an adhesive is put between lenses or the adhesive is put between the lens and an upper surface of a transparent substrate, such as a lens space b and a space d between a lens and an image capturing element 251 as illustrated in FIG. 30, the thickness of the adhesive varies significantly. For example, when an adhesive sheet with the adhesive of the thickness of 50 µm is used, the variation will be plus or minus 10 µm. When the adhesive is in a cohesive liquid form, the variation will be greater at the application of the adhesive. Because of this, the lens space b and the space d between the lens and the image capturing element 251 vary.

According to the structure of Reference 3, an adhesive 305 is filled in a space portion made by a step portion on the further outside of a contacting surface P, the contacting surface P determining the lens space b. Although the adhesive 305 adheres the substrates 302 and 304, if the amount of the adhesive 305 is too much, the adhesive 305 spreads from the space portion into the contacting surface P, which creates a gap in the contacting surface P. This will create a variation of lens spacing and results in unstable optical characteristics.

The present invention is intended to solve the conventional problems described above. The objective of the present invention is to provide an optical element wafer capable of stabilizing its optical characteristics and stabilizing a space between lenses or of a space between a lens and an image capturing element; an optical element individualized from the optical element wafer; an optical element wafer module in which the plurality of optical element wafers are laminated; an optical element module individualized from the optical element wafer module; a method for manufacturing the optical element module by cutting the optical element wafer or optical element wafer module; an electronic element wafer module in which the optical element wafer or optical element wafer module is modularized with an electronic element wafer; a method for manufacturing an electronic element module in which the electronic element wafer module is simultaneously cut into pieces or the optical element or the optical element module is modularized with the electronic element, to manufacture the electronic element module; an electronic element module manufactured by the method for manufacturing the electronic element module; and an electronic information device, such as a camera-equipped cell phone device, including the electronic element module used as an image input device in an image capturing section thereof.

An optical element according to the present invention includes: an optical surface at a center portion thereof; and a spacer section having a predetermined thickness on an outer circumference side of the optical surface, wherein a bottom portion for positioning an adhesive is provided on a further outer circumference side of the spacer section with a tapered portion interposed therebetween, thereby achieving the objective described above. The adhesive will not overflow from the bottom portion (step portion) when the adhesive is provided at the bottom portion (step portion) except for the tapered portion on the outer circumference side.

Preferably, in an optical element according to the present invention, a surface height of the spacer section is configured to be higher than a surface height of the optical surface, and the spacer section is connected to the optical surface with an inclined surface interposed therebetween.

Still preferably, in an optical element according to the present invention, the spacer section is provided for the optical surface.

Still preferably, in an optical element according to the present invention, the spacer section is a protruded portion or a planarized portion, which is further protruded than a convex shape of the optical surface, surrounding the optical surface from an outer circumference end portion of the optical surface with the inclined surface interposed therebetween.

Still preferably, in an optical element according to the present invention, the protruded portion is annularly protruded, or is protruded as part of the annular shape, more than the convex shape of the optical surface, from the outer circumference end portion of the optical surface with the inclined surface interposed therebetween.

Still preferably, in an optical element according to the present invention, when a securing tape is adhered on the spacer section to cover an upper part thereof during individual cutting, the surface height of the spacer section is configured to be higher than the surface height of the optical surface so that the securing tape does not adhere on the optical surface.

Still preferably, in an optical element according to the present invention, the optical surface and a protruded portion or planarized portion, which is more protruded than the optical surface, are provided on either a front surface or a back surface of the optical element.

Still preferably, in an optical element according to the present invention, a part or all of a top surface of the annular protruded portion includes a planarized surface.

Still preferably, in an optical element according to the present invention, a difference between the surface height of the spacer section and the surface height of the optical surface is between 20 μm and 100 μm.

Still preferably, in an optical element according to the present invention, a difference between the surface height of the spacer section and the surface height of the optical surface is 50 μm plus or minus 10 μm.

Still preferably, in an optical element according to the present invention, the optical surface and the spacer section are simultaneously formed with a transparent resin material.

Still preferably, in an optical element according to the present invention, the optical element is a lens.

Still preferably, in an optical element according to the present invention, the optical element is an optical function element for directing output light straight to be output and refracting and guiding incident light in a predetermined direction.

Still preferably, in an optical element according to the present invention, the optical surface is a circle with a diameter of 1 mm plus or minus 0.5 mm.

Still preferably, in an optical element according to the present invention, a support plate including one or a plurality of through holes penetrating only a portion corresponding to the optical surface is provided inside the transparent resin material.

Still preferably, in an optical element according to the present invention, the support plate has light shielding characteristics, an inner circumference surface of the through hole of the support plate is constituted of an inclined surface, an outer circumference portion side of the through hole corresponds to the spacer section, and the outer circumference portion side of the through hole is thicker than a further outer circumference portion side thereof.

Still preferably, in an optical element according to the present invention, a through hole and/or a concave portion is provided for releasing the resin material when forming the resin in a further outer circumference portion of the support plate.

An optical element module according to the present invention is provided, in which a plurality of the optical elements according to the present invention are laminated, where an adhesive is positioned in a space portion surrounded by upper and lower bottom portions provided on a further outer circumference side of the respective planarized surfaces of the spacer sections of the upper optical elements and the spacer sections of the lower optical elements, so that the upper optical elements and the lower optical elements are adhered to each other, thereby achieving the objective described above.

Preferably, in an optical element module according to the present invention, the adhesive is positioned only in the space portion made by the bottom portion with the upper and lower tapered portions interposed therebetween, the adhesive is at least not positioned in the space portion made by the upper and lower tapered portions, and at least the space portion made by the upper and lower tapered portions includes a space large enough for the adhesive to be pressed and spread by the lower most optical element wafer and the transparent support substrate, yet not be spread to the spacer section, when adhering.

Still preferably, in an optical element module according to the present invention, of an uppermost optical element and a lower most optical element, a height of a surface of a spacer section of at least either optical element is higher than a height of a surface of an optical surface of the optical element.

Still preferably, in an optical element module according to the present invention, of the plurality of optical elements, a lens space between the upper optical element and the lower optical element is controlled by direct contact of respective planarized surfaces of the spacer section of the upper optical element and the spacer section of the lower optical element.

Still preferably, in an optical element module according to the present invention, of the plurality of optical elements, a lens space between the upper optical element and the lower optical element is controlled by the interposing of only a light shielding plate in between at least respective planarized surfaces of the spacer section of the upper optical element and the spacer section of the lower optical element.

Still preferably, in an optical element module according to the present invention, the adhesive is provided on an outside of the optical surface and an inside of a quadrilateral along dicing lines at a predetermined width, and a vent is provided at a corner portion and/or a side portion of the quadrilateral adhesive.

Still preferably, in an optical element module according to the present invention, an adhesive for capturing dust is further provided on an outside of the optical surface and an inside of a quadrilateral along dicing lines at a predetermined width, the adhesive being cohesive even after a curing of the resin.

Still preferably, in an optical element module according to the present invention, part or all of the adhesive for capturing dust is provided facing a vent inside the quadrilateral adhesive.

Still preferably, in an optical element module according to the present invention, the adhesive has light shielding characteristics.

An optical element module according to the present invention is provided, where of an upper surface, except for the optical surface, and a side surface of the plurality of optical elements, the optical element module further includes a light shielding holder for shielding at least the upper surface, thereby achieving the objective described above.

An optical element module according to the present invention is provided, of an upper surface, except for the optical surface, and a side surface of the optical element according to the present invention, the optical element module further includes a light shielding holder for shielding at least the upper surface, thereby achieving the objective described above.

An optical element wafer according to the present invention is provided, in which the plurality of optical elements according to the present invention are simultaneously formed and arranged in two dimensions, thereby achieving the objective described above.

An optical element wafer module according to the present invention is provided, in which the plurality of optical element wafers according to the present invention are laminated by aligning the optical surfaces thereof, thereby achieving the objective described above.

An optical element wafer module according to the present invention is provided, in which the plurality of optical element modules according to the present invention are arranged in two dimensions, thereby achieving the objective described above.

A method for manufacturing an optical element module according to the present invention is provided, the method including: a step of adhering a securing tape to at least either of a front surface side or a back surface side of the optical element wafer according to the present invention, an optical element wafer module in which the plurality of optical element wafers are laminated, or the optical element wafer module according to the present invention; and a cutting step of simultaneously cutting the optical element wafer or the optical element wafer module along dicing lines to be individualized, thereby achieving the objective described above.

An electronic element wafer module according to the present invention is provided, including: an electronic element wafer in which a plurality of electronic elements are arranged; a resin adhesion layer formed in a predetermined area on the electronic element wafer; a transparent support substrate covering the electronic element wafer and fixed on the resin adhesion layer; and the optical element wafer according to the present invention, an optical element wafer module in which the plurality of optical element wafers are laminated, or the optical element wafer module according to the present invention, any of which is adhered on the transparent support substrate so that each optical element corresponds to each of the plurality of electronic elements, thereby achieving the objective described above.

Preferably, in an electronic element wafer module according to the present invention, a space between the lowermost optical element wafer and the electronic element is controlled by a planarized surface of a spacer section of the lower most optical element wafer and a planarized surface of the transparent support substrate in direct contact with each other.

Still preferably, in an electronic element wafer module according to the present invention, an adhesive is positioned only in a space portion surrounded by a bottom portion on a further outer circumference side of a planarized surface of the spacer section of the lower most optical element wafer and the transparent support substrate, so that the lower most optical element wafer and the transparent support substrate are adhered to each other.

Still preferably, in an electronic element wafer module according to the present invention, the adhesive is positioned only in a space portion made by the bottom portion and the adhesive is at least not positioned in a space portion made by the tapered section, and at least the space portion made by the tapered section includes a space large enough for the adhesive to be pressed and spread by the lower most optical element wafer and the transparent support substrate when adhering.

Still preferably, in an electronic element wafer module according to the present invention, the electronic element is an image capturing element including a plurality of light receiving sections for performing an electronic conversion on and capturing an image of image light from a subject.

Still preferably, in an electronic element wafer module according to the present invention, the electronic element is a light emitting element for outputting output light and a light receiving element for receiving incident light.

A method for manufacturing an electronic element module according to the present invention is provided, the method including: a step of adhering a securing tape to a front surface side of the optical element wafer or the optical element wafer module of the electronic element wafer module according to the present invention; and a cutting step of simultaneously cutting the electronic element wafer module from the electronic element wafer side along dicing lines to be individualized, thereby achieving the objective described above.

A method for manufacturing an electronic element module according to the present invention is provided, the method including: an image capturing element wafer unit forming step of adhering and fixing a transparent support substrate by a resin adhesion layer in such a manner to cover an electronic element wafer, in which a plurality of electronic elements are arranged, to form an image capturing element wafer unit; a cutting step of simultaneously cutting the image capturing element wafer unit from the electronic element wafer side along dicing lines to be individualized into image capturing element units; and a step of adhering the optical element module manufactured by the method for manufacturing the optical element module according to the present invention to the image capturing element unit in such a manner that the image capturing element corresponds to the optical element, thereby achieving the objective described above.

An electronic element module according to the present invention is provided, which is cut from the electronic element wafer module according to the present invention for each or a plurality of the electronic element modules, thereby achieving the objective described above.

An electronic information device according to the present invention includes an electronic element module individualized by cutting the electronic element wafer module according to the present invention, as a sensor module used in an image capturing section thereof, thereby achieving the objective described above.

An electronic information device according to the present invention includes an electronic element module individualized by cutting the electronic element wafer module according to the present invention, used in an information recording and reproducing section thereof, thereby achieving the objective described above.

An electronic information device according to the present invention includes an electronic element module manufactured by the method for manufacturing the electronic element module according to the present invention, thereby achieving the objective described above.

The functions of the present invention having the structures described above will be described hereinafter.

According to the present invention, in an optical element module, an adhesive is provided only in a space portion surrounded by upper and lower bottom portions provided with upper and lower tapered sections interposed therebetween on a further outer circumference side of each planarized surface of a spacer section of an upper optical element and a spacer section of a lower optical element, so as to adhere the upper optical element and the lower optical element. Thus, the adhesive is provided only in the space portion made by the upper and lower bottom portions, and the adhesive is at least not provided in a space portion made by upper and lower tapered sections. A sufficient space is provided in the space portion made at least by the upper and lower tapered sections so that the adhesive can be pressed and spread by the upper and lower optical elements, yet will not be spread to the spacer section, when adhering. As a result, the adhesive will not be put between the upper and lower spacer sections and the upper and lower spacer sections are indirect contact with each other, and the lens spacing will be stabilized and the optical characteristics will be suitable.

Further, in an electronic element module, in addition to the structure described above, an adhesive is provided only in a space portion, surrounded by a bottom portion and a transparent support substrate, the bottom portion provided with a tapered section interposed therebetween, on a further outer circumference side of a planarized surface of the spacer section of the lower most optical element, so as to adhere the lower most optical element and the transparent support substrate. Thus, the adhesive is provided only in the space portion made by the bottom portion, but the adhesive is at least not provided in the space portion made by the tapered section, and at least the space portion made by the tapered section includes a space large enough for the adhesive to be pressed and spread by the lowermost optical element and the transparent support substrate, yet not be spread to the spacer section, when adhering. As a result, since there will be no interposition of the adhesive in the spacer section as done conventionally, there will be no variation in the lens space or the space between the lens and the image capturing element, thereby stabilizing the lens space or the space between the lens and the image capturing element and making the optical characteristics suitable.

According to the present invention with the structure described above, the adhesive is provided only in the space portion surrounded by the bottom portion provided with the tapered section interposed therebetween on the further outer circumference side of the planarized surface of the spacer section of the optical element, but the adhesive is at least not provided in the space portion made by the tapered section. When adhering, a space large enough for the adhesive to be pressed and spread is provided at least by the space portion made by the tapered section. As a result, since the overall thickness is not negatively influenced due to the interposition of the adhesive, which is negatively influenced conventionally, the lens space or the space between the lens and the image capturing element will be stabilized without variations therebetween, and the optical characteristics will be suitable. Furthermore, since there is no change from the conventional cutting process, the manufacturing cost can remain low.

These and other advantages of the present invention will become apparent to those skilled in the art upon reading and understanding the following detailed description with reference to the accompanying figures.

BRIEF DESCRIPTION OF THE DRAWINGS

FIG. 16(a) is a perspective view thereof. FIG. 16(b) is a top view thereof.

FIG. 22(a) is a view illustrating a case where cut guiding holes are long holes. FIG. 22(b) is a view illustrating a case where the cut guiding holes are cross-shaped and L-letter shaped.

FIG. 23(a) is a view illustrating a state where the adhesive is applied when the cut guiding holes of the light shielding wafer are long holes. FIG. 23(b) is a view illustrating a state where the adhesive is applied when the cut guiding holes of the light shielding wafer are cross-shaped and L-letter shaped holes.

FIG. 25(a) is an essential part cross sectional view of a front surface shape of the first lens. FIG. 25(b) is an essential part cross sectional view of a back surface shape when the first lens is adhered on a glass plate by the adhesive. FIG. 25(c) is an essential part cross sectional view of a joint surface of the first lens and the second lens. FIGS. 25(d), 25(e) and 25(g) are each an essential part cross sectional view of a joint surface when the light shielding plate is put directly in between the first lens and the second lens. FIG. 25(f) is an essential part cross sectional view of a joint surface when the light shielding plate is put directly in between a glass plate and the first lens 406.

FIG. 26(a) is an essential part cross sectional view of a lens joint surface when a light shielding plate is not used. FIG. 26(b) is a plan view thereof. FIG. 26(c) is an essential part cross sectional view of a lens joint surface when the light shielding plate is used. FIG. 26(d) is a plan view thereof.

Figure 1:
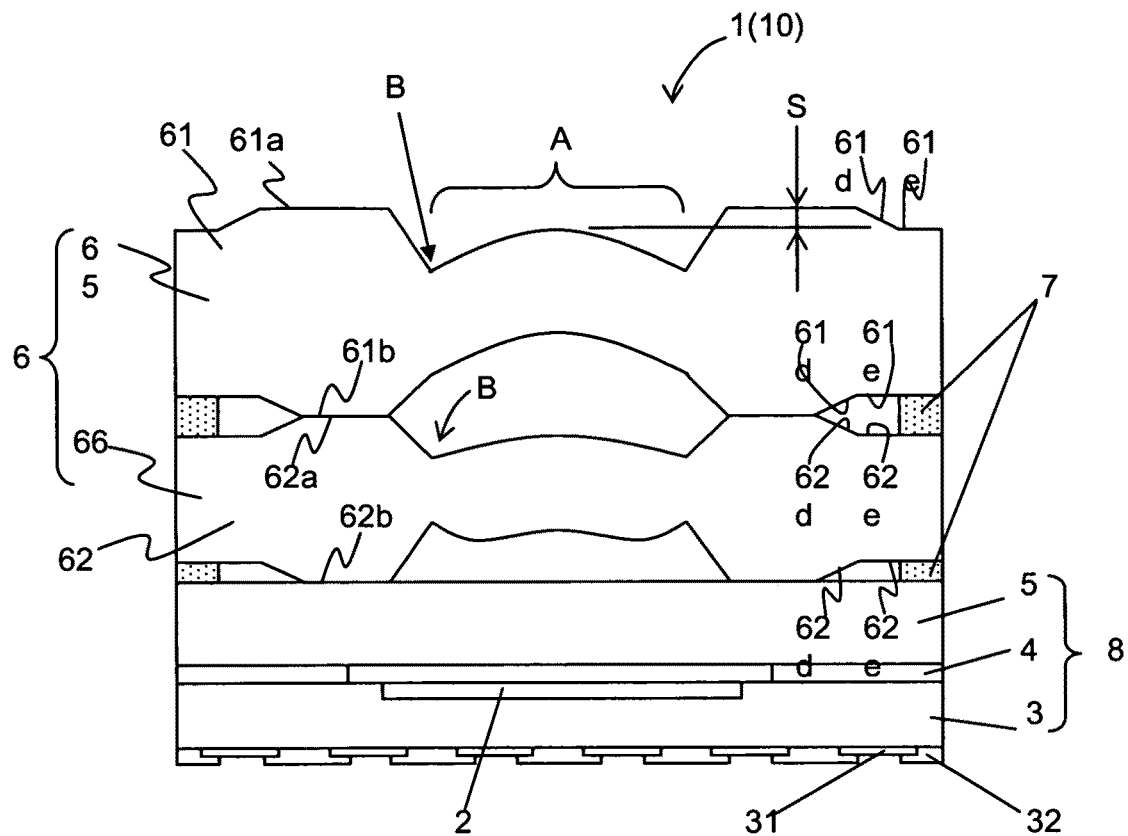
FIG. 1 is an essential part longitudinal cross sectional view illustrating an exemplary structure of an electronic element wafer module according to Embodiment 1 of the present invention.

1, 1A, 1B image capturing element wafer module (electronic element wafer module)
2 image capturing element (electronic element)
3 image capturing element wafer
31 external connection terminal
32 insulation film
4 resin adhesion layer
5 transparent support substrate
6, 6A, 6B lens wafer module (optical element wafer module)
60 lens module
61, 61A, 61B first lens
61a, 61b, 62a, 62b, 61Ba, 61Bb, 62Ba, 62Bb protruded section (spacer section)
61c transparent resin material
61C, 62C lens support plate
62, 62A, 62B second lens
63 upper metal mold
64 lower metal mold
65, 65A, 65B first lens wafer (optical element wafer)
66, 66A, 66B second lens wafer (optical element wafer)
7, 7a adhesive
7b space portion
71, 72 vent
8 image capturing element wafer unit
80 image capturing element unit
81 upper metal mold
82 lower metal mold
83 transparent resin material
84, 84A, 84B, 84a, 184, 184A, 184B, 184a first lens
85, 85A, 85a, 185, 185A, 185a second lens
86, 86A, 186, 186A lens module
87, 187 light shielding holder
88, 89, 188, 189 lens module
187B light shielding holder wafer
189B lens wafer module
9 cut-securing tape
9a cut-securing tape
9b surface-protecting tape
10, 10A, 10B, 10C, 10D image capturing element module (sensor module)
11 transparent support plate
12, 15 metal mold
13 lens-forming transparent resin
13a first lens front surface shape
13b first lens back surface shape
14 ultraviolet ray (UV) irradiation device
90 electronic information device
91 solid-state image capturing apparatus
92 memory section
93 display section
94 communication section
95 image output section
A optical surface
B outer circumference end portion of optical surface
C optical axis
DL dicing line
S difference between a surface height of a protruded section and a surface height of a lens area (optical surface A)
F1 planarized section
F2 annular protruded section
400 image capturing element module
401 image capturing element chip
402 light shielding holder
402B, 406B inclined surface
403 image capturing element
404 resin adhesion layer 405 transparent support substrate
406 first lens
406A planarized surface
406C, 406D, 407D spacer section
406E, 407E bottom surface portion
407 second lens
408 lens module
409 adhesive
409A vent
410, 410A-410C, 410E light shielding plate
411a lens opening (through hole)
411b long hole (rectangular shape hole)
411c cross-shaped hole
411d L-letter shaped hole
411e groove portion
411, 411A, 411B light shielding plate wafer
412 image capturing element chip module
416 first lens wafer
417 second lens wafer
418 lens wafer module
420, 421 spacer section
A optical surface
B aperture opening
G direct contact portion
H adhering portion Description of the Preferred Embodiments Hereinafter, as Embodiments 1, 2 and 4 of an optical element wafer, an optical element wafer module, a method for manufacturing an optical element module, an electronic element wafer module, an electronic element module, and a method for manufacturing the electronic element module according to the present invention, the case where the present invention is applied to a lens wafer, a lens wafer module, a method for manufacturing a lens module, an image capturing element wafer module, an image capturing element (sensor module) and a method for manufacturing the image capturing element module, will be described in detail with reference to the attached figures. Further, as Embodiment 3 of an optical element individualized from the optical element wafer, and an optical element module individualized from the optical element wafer module, a lens and a lens module will be described in detail with reference to the attached figures. Further, as Embodiment 5, an electronic information device, such as a camera-equipped cell phone device or a television telephone device, will be described in detail with reference to the attached figures, and the electronic information device includes the image capturing element module with the lens or lens module of Embodiment 3 used therein, or the image capturing element module of Embodiment 1, 2 or 4, as a sensor module in an image capturing section, which functions as an image input section, of the electronic information device.

(Embodiment 1)

FIG. 1 is an essential part longitudinal cross sectional view illustrating an exemplary unitary structure of an electronic element wafer module according to Embodiment 1 of the present invention.

In FIG. 1, an image capturing element wafer module 1, which functions as an electronic element wafer module according to Embodiment 1, includes: an image capturing element wafer 3 as an electronic element wafer in which a plurality of image capturing elements 2 are arranged in a matrix, the image capturing elements 2 including a plurality of light receiving sections for performing a photoelectric conversion on and capturing an image of image light from a subject; a resin adhesion layer 4 formed on the image capturing element wafer 3 and in between adjacent image capturing elements 2; a transparent support substrate 5, such as a glass plate, adhered and fixed on the resin adhesion layer 4; and a lens wafer module 6, as an optical element wafer module, provided such that lens positions correspond to the plurality of respective image capturing elements 2. FIG. 1 illustrates a single unit image capturing element module of the image capturing element wafer module 1, and in an actual condition, a large number of the unitary image capturing element modules are provided and the large number of image capturing element modules (sensor modules 10) are individualized by the cutting of the image capturing element wafer module 1.

The image capturing element wafer 3 includes a large number of the image capturing elements 2 in a matrix on the front surface side (a plurality of light receiving sections, which constitute a plurality of pixels, are provided for each image capturing element 2), and a plurality of through holes penetrating a wafer back surface to below a pad (electrode pad) of a front surface for each image capturing element 2. A side wall and back surface of each of the through holes are covered with an insulation film, and a wiring layer contacting the pad is formed to the back surface through the through hole. An insulation film 32 is formed on an external connection terminal 31, which is connected to the wiring layer, and on the back surface. The insulation film 32 has an opening at a portion where a solder ball (not shown) is formed above the external connection terminal 31 of the wiring layer, so that the solder ball (not shown) is formed exposed to the outside. Herein, a case has been described where the image capturing element wafer 3 includes a penetrating electrode for each image capturing element 2; however there is also a case where such penetrating electrode is not included.

The resin adhesion layer 4 is formed in the periphery part of the image capturing element 2 on the wafer surface to adhere the image capturing element wafer 3 and the transparent support substrate 5. When the upper part of the semiconductor surface is covered by the transparent support substrate 5, the resin adhesion layer 4 encloses an internal space above a sensor area where the image capturing element 2, as an electronic element above the image capturing element wafer 3, is provided. The resin adhesion layer 4 is formed at a predetermined location on the image capturing element wafer 3 using an ordinary photolithography technique. The transparent support substrate 5 is adhered on the resin adhesion layer 4. The resin adhesion layer 4 can also be formed using a screen printing method or a dispense method, other than the photolithography technique.

The lens wafer module 6 includes a first lens wafer 65 and a second lens wafer 66 laminated on the transparent support substrate 5 in such a manner to correspond to the image capturing element 2. The first lens wafer 65 functions as an optical element wafer in which a plurality of first lenses 61 are arranged in two dimensions. The second wafer 66 functions as an optical element wafer in which a plurality of second lenses 62 are arranged in two dimensions. An optical surface A of the first lens 61 is in a shape of a convex lens and is externally protruded. The outer circumference portion of the optical surface A is annularly protruded more than the most-protruded top portion at the center portion of the optical surface A. In FIG. 1, annularly protruded sections 61a and 61b of the optical surface A are illustrated as a planarized surface in the first lens 61; however, without the limitation to the annular planarized surface, any shape can be included, such as a circular arc protruded section and a wavy shape with circular arc protruded sections arranged on one column, as long as it is an annular protruded section.

In the first lens wafer 65: the plurality of first lenses 61 are provided in two dimensions as optical elements; the optical surface A of the lens area is provided at the center portion of each of the plurality of first lenses 61; the protruded sections 61a and 61b having a predetermined thickness are provided on the outer circumference side of the optical surface A as a spacer section; and the surface height of the protruded sections 61a and 61b as a spacer section is higher than the surface height of the lens area (optical surface A) and a difference S exists, which is a difference between the surface height of the protruded sections 61a and 61b and the surface height of the lens area (optical surface A). Prior to the cutting stage, a cut-securing tape 9 to be described later is adhered to each planarized surface of the protruded sections 61a and 61b to cover the upper part of the optical surface A of the lens area. In this case, as the difference S, the surface height of each planarized surface of the protruded sections 61a and 61b is configured to be higher than the surface height of the top portion of the lens area (optical surface A) so that an adhesive surface of the cut-securing tape 9 to be described later does not adhere to the lens area (optical surface A).

As described above, in the protruded sections 61a and 61b as a spacer section, the top surface of the protruded sections 61a and 61b are annularly protruded from the outer circumference end portion of the lens area (optical surface A) as an optical element area and are higher than the top portion of the convex surface of the optical surface A, and the top surface is a planarized surface. When the optical surface A is a round shape with a diameter of 1 mm plus or minus 0.5 mm, the difference S between the surface height of the spacer section (protruded section 61a) and the surface height of the lens area (optical surface A) is 20 µm to 100 µm. Further, preferably, in this case, the difference S between the surface height of the spacer section (protruded section 61a) and the surface height of the lens area (optical surface A) is about 50 µm (50 µm plus or minus 10 µm).

At a position higher than a high position (top portion) at a center portion of a convex lens surface of the first lens 61 on the opposite side from the image capturing element 2 side, provided is an annular top planarized surface (planarized surface of an annular protruded section 61a) of a peripheral flange (spacer section; protruded sections 61a and 61b) with a predetermined thickness on the outer circumference side of the convex lens surface.

The second lens 62 has a front surface and a back surface, both of which are convex optical surfaces A. Protruded sections 62a and 62b are planarized surfaces annularly protruded from an outer circumference end portion B, which is the outer circumference of the optical surface A, and are annularly protruded more than the convex shape of the optical surface A. The annular protruded section 61b, which is on the outer circumference side of the optical surface A on the back surface of the first lens 61, and the annular protruded section 62a, which is on the outer circumference side of the optical surface A on the front surface of the second lens 62, contact each other on the respective planarized surfaces. An adhesive 7 is provided in a space made by bottom portions 61e and 62e (lower portions or step portions) further outside of the annular protruded sections 61b and 62a. The first lens 61 and the second lens 62 are vertically adhered and fixed to each other at the space in between them by the adhesive 7. Similar to this, the transparent support substrate 5 and the annular protruded section 62b at the outer circumference end portion B of the optical surface A on the back surface contact each other at the respective planarized surfaces. The adhesive 7 is provided in the space made by the bottom portion 62e on the further outside of the annular protruded section 62b. The transparent support substrate 5 and the second lens 62 are vertically adhered and fixed to each other at the space in between them by the adhesive 7.

Because of the structure described above, the space between the first lens 61 and the second lens 62 as well as the space between the second lens 62 and the transparent support substrate 5 touch each other and are regulated by the respective planarized surfaces of the annular protruded sections 61b and 62a and the annular protruded section 62b. As a result, a variation in the thickness or amount of the adhesive 7 will not negatively influence the lens module, and the space between the lenses becomes stable. That is, the spaces between the lenses are determined by the contacting surfaces (protruded sections 61b, 62a and 62b) of the first lens 61 and the second lens 62, and the adhesion is made in the space portion (gap portion) made by the bottom portion further outside the contacting surfaces with the upper and lower tapered sections 61d and 62d interposed therebetween. Therefore, even if there is too much adhesive 7, the adhesive 7 only spreads within the gap portion and will not reach the protruded sections 61b, 62a or 62b, and a variation in the thickness or amount of the adhesive 7 does not cause a problem. As a result, the lens space becomes stable, and further, the optical characteristics of the lens module 6 become stable.

Specifically, the adhesive 7 is provided only in all or part of the space portion surrounded by the upper and lower bottom portions 61e and 62e provided with the upper and lower tapered sections 61d and 62d interposed therebetween on the further outer circumference side of the respective planarized surfaces of the protruded section 61b of the upper optical element wafer 65 and the protruded section 62a of the lower optical element wafer 66, so as to adhere the upper optical element wafer 65 and the lower optical element wafer 66. Thus, the adhesive 7 is positioned only in all or part of the space portion made by the upper and lower bottom portions 61e and 62e, but the adhesive 7 is not positioned in the space portion made by the upper and lower tapered sections 61d and 62d. Therefore, when adhering, a space large enough for the adhesive 7 to be pressed from the top and bottom and spread by the upper optical element wafer 65 and the lower optical element wafer 66 is provided by the space portion made by the upper and lower tapered sections 61d and 62d.

Further, the adhesive 7 is positioned only in the space portion surrounded by the bottom portion 62e, which is provided with the tapered section 62d interposed therebetween on the further outer circumference side of the planarized surface of the protruded section 62b of the lowermost optical element wafer 66, and the transparent support substrate 5, so as to adhere the lowermost optical element wafer 66 and the transparent support substrate 5. Thus, the adhesive 7 is only provided in the space portion made by the bottom portion 62e, but the adhesive 7 is not provided in the space portion made by the tapered section 62d; and when adhering, a space large enough for the adhesive 7 to be pressed from the top and bottom and spread by the lowermost optical element wafer 62 and the transparent support substrate 5 is provided by the space portion made by the tapered section 62d.

Hereinafter, a method for manufacturing the image capturing element wafer module 1 with the structure described above will be described.

First, a method for forming the first lens 61 of FIG. 1 will be described.

Figure 2:
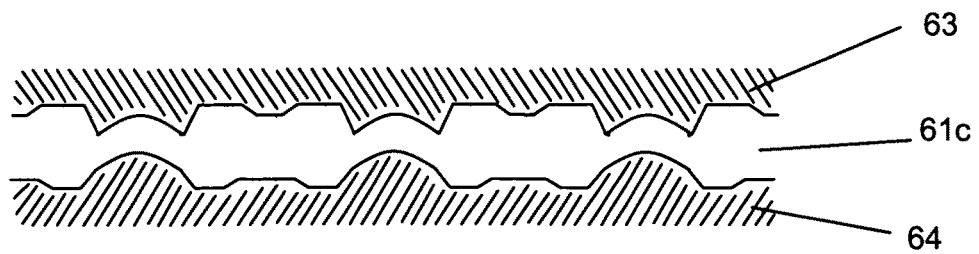
FIG. 2 is an essential part longitudinal cross sectional view for describing a method for forming a first lens of FIG. 1.

FIG. 2 is an essential part longitudinal cross sectional view for describing the method for forming the first lens 61 of FIG. 1.

In FIG. 2, a transparent resin material 61c of the first lens 61 is put between and pressed by an upper metal mold 63 corresponding to the front surface shape of the first lens 61 and a lower metal mold 64 corresponding to a back surface shape of the first lens 61 from the top and bottom. At this stage, the transparent resin material 61*c* of the first lens 61 is controlled to have a predetermined lens thickness. The formed transparent resin material 61*c* forms a first lens wafer 65 in which a plurality of first lens 61 are successively arranged in a two dimensional matrix at a wafer scale. Any of ultraviolet ray (UV) curing resin, thermosetting resin, and UV and heat curing resin can be used as the transparent resin material 61*c*.

The upper metal mold 63 and the lower metal mold 64 constitute a metal form that arranges the shape of the plurality of first lenses 61 in a two dimensional matrix at a wafer scale. As the method for forming the metal molds, a front surface lens shape is formed with the upper metal mold 63 and a back surface lens shape is formed with the lower metal mold 64 by cutting process or Ni (nickel) electroplating.

Herein, the method for manufacturing the first lens wafer 65, which is constituted of the plurality of first lenses 61 of FIG. 1, is described. In addition, regarding a method for manufacturing a second lens wafer 66, which is constituted of the plurality of second lenses 62 of FIG. 1, although the front surface lens shape and back surface lens shape are different from those in the case of the first lens 61, they can be manufactured in the same manner as the case of the first lens 61 of FIG. 1.

Next, a method for manufacturing an image capturing element module (sensor module 10) by modularizing the first lens wafer 65 and the second lens wafer 66 with the image capturing element wafer 3 and then individualizing it into the image capturing element module as an electronic element module.

Figure 3:
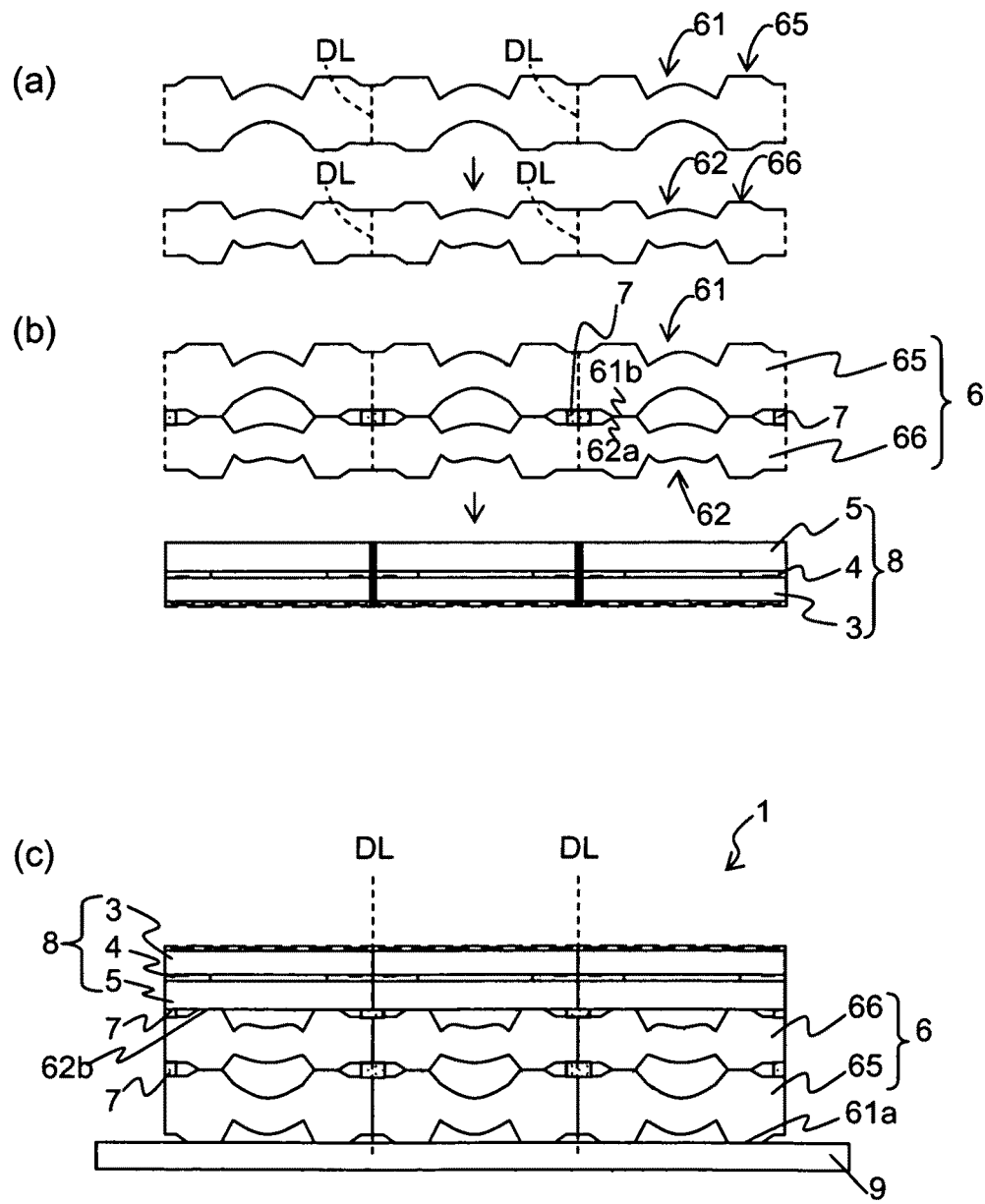
FIGS. 3(a) to 3(c) are each an essential part longitudinal cross sectional view illustrating each step for manufacturing an image capturing element module by modularizing a first lens wafer, a second lens wafer and an image capturing element wafer and subsequently individualizing them.

FIGS. 3(*a*) to 3(*c*) are each an essential part longitudinal cross sectional view illustrating each manufacturing step for manufacturing an image capturing element module by modulating the first lens wafer and the second lens wafer with the image capturing element wafer to be individualized.

First, as illustrated in a lens adhering step of FIG. 3(*a*), the adhesive 7 is applied between the first lens 61 and the second lens 62 including the dicing line DL indicated by a dash line. At the portion where the adhesive 7 is applied, the lower annular protruded section 61*b* on the outer circumference side from the optical surface A of the back surface of the first lens 61 and the upper annular protruded section 62*a* on the outer circumference side from the optical surface A of the front surface of the second lens 62 directly contact each other at the respective planarized surfaces, and the adhesive 7 is positioned in a concave portion on the further outside of the lower annular protruded section 61*b* and the upper annular protruded section 62*a*.

Next, an optical axis C of the first lens 61 and an optical axis C of the second lens 62 are aligned so that they coincide to each other. The first lens wafer 65 of the upper first lens 61 and the second lens wafer 66 of the lower second lens 62 formed at the wafer scale are adhered and laminated by the adhesive 7 in such a manner to be stacked vertically as illustrated in FIG. 3(*b*). As a result, the lens wafer module 6, which is constituted of the two lens wafer 65 and 66, is manufactured.

Further, as illustrated in a modularizing step of FIG. 3(*b*), the transparent support substrate 5, such as a glass plate, is adhered and fixed on the image capturing element wafer 3 by the resin adhesion layer 4 in such a manner to cover the image capturing element wafer 3, to manufacture an image capturing element wafer unit 8.

On the transparent support substrate 5 of the image capturing element wafer unit 8, the lens wafer module 6, which is constituted of two lens wafers 65 and 66, is adhered with the image capturing element wafer unit 8 in such a manner that each of the optical axes C of the first lens 61 and the second lens 62 is aligned with the center of each image capturing element 2 of the image capturing element wafer 3, to manufacture the image capturing element wafer module 1 illustrated in FIG. 3(*c*). At the adhering stage, if the lens wafers 65 and 66, for example, of the wafer scale are warped and the overall lens surface is vacuumed to a jig to correct the warping, there is no need to form a jig that conforms to the optical surface with the two lens wafers 65 and 66 of the present structure. This makes the manufacturing of a jig for each model unnecessary and leads to the reduction of the cost.

Next, as illustrated in a cutting step of FIG. 3(*c*), the cut-securing tape 9 is adhered on the front surface side of the plurality of first lenses 61 of the wafer-scaled first lens wafer 65. With the image capturing element wafer 3 side of the image capturing element wafer unit 8 facing up, the image capturing element wafer module 1 is simultaneously cut along the dicing lines DL illustrated with a dash line.

When cutting the image capturing element wafer module 1, the optical surface of the front surface of the first lens 61 is protected by the cut-securing tape 9 adhered on the planarized surface of the annular protruded section on the outer circumference side of the optical surface, and therefore, cutting water does not enter inside the optical surface. In addition, the cut-securing tape 9 does not contact the optical surface of the front surface of the first lens 61, and therefore, the adhesive of the cut-securing tape 9 does not adhere to the optical surface of the first lens 61. In addition, in the cutting with a dicer or a wire along the dicing line DL, the conventional cut-securing tape 9 is used, so that there is no change in the conventional process with regard to the cutting step.

Next, as described with reference to FIGS. 3(*a*) to 3(*c*), instead of the case where the lens wafer module 6 is modularized with the image capturing element wafer 3 to be individualized to manufacture the image capturing element module, the case where the lens wafer module 6 is individualized to manufacture the lens module, and the image capturing element wafer unit 8 is individualized to combine with the lens module will be described.

Figure 4:
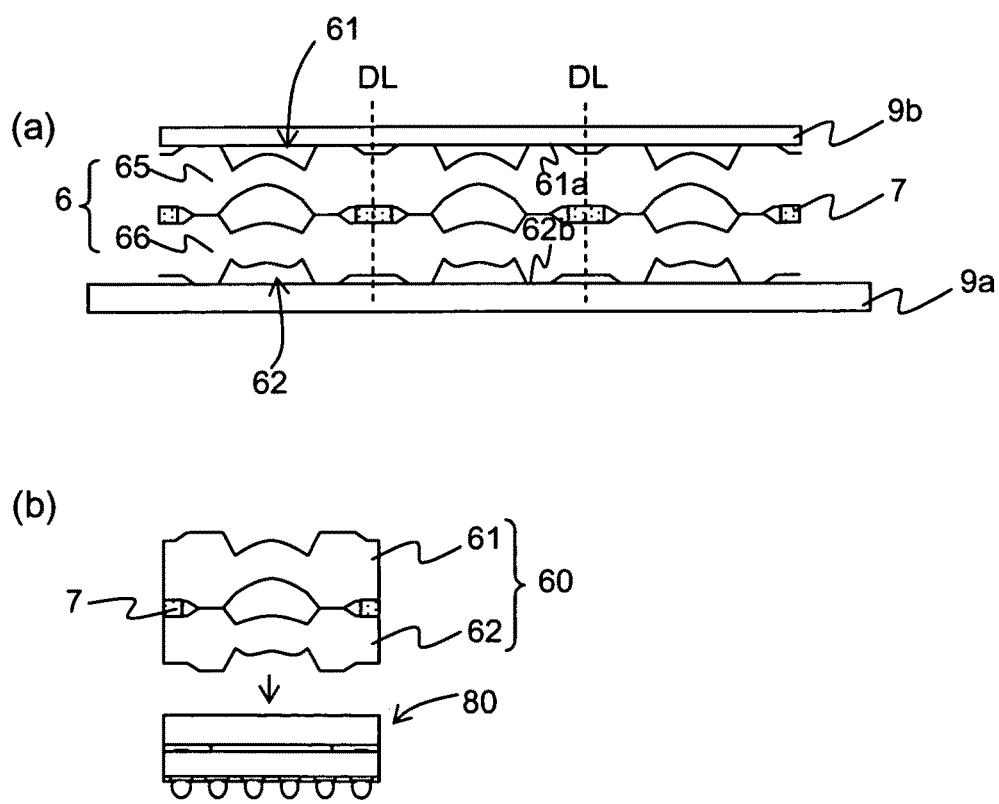
FIG. 4(a) is an essential part longitudinal cross sectional view illustrating a cutting step of a lens wafer module of FIG. 1.
FIG. 4(b) is an essential longitudinal cross sectional view illustrating an integrating step of an image capturing element module.

FIG. 4(*a*) is an essential longitudinal cross sectional view illustrating a cutting step of the lens wafer module of FIG. 1. FIG. 4(*b*) is an essential longitudinal cross sectional view illustrating a combining step of the image capturing element module.

As illustrated in a cutting step of the lens wafer module of FIG. 4(*a*), in the state where the first lens wafer 65 formed with the plurality of first lenses 61 and the second lens wafer 66 formed with the plurality of second lenses 62, which are formed in the wafer scale, are adhered vertically, they are cut simultaneously along the dicing lines DL to manufacture a lens module 60 illustrated in FIG. 4(*b*). During the cutting stage, a cut-securing tape 9*a* is adhered to the planarizing surface of the annular protruded section 62*b* on the outer circumference side of the second lens 62 of the second lens wafer 66, and in order to protect the lens surface, a surface-protecting tape 9*b* is adhered to the planarized surface of the annular protruded section 61*a* on the outer circumference side of the first lens 61 of the first lens wafer 65. As a result, during the cutting stage, each optical surface of the first lens 61 and the second lens 62 is sealed and protected by the cut-securing tape 9*a* and the surface-protecting tape 9*b*, so that each optical surface does not become dirty from cutting water. However, there is also a method for cleaning the optical surface A by spin cleaning without adhering the surface-protecting tape 9b but maintaining the cut-securing tape 9a on the lens after the cutting. Thus, the adhering of the cut-securing tape 9a is essential, but the adhering of the surface-protecting tape 9b is not essential. It is possible to clean the lens surface by spin cleaning without using the surface-protecting tape. Therefore, it is suitable for the spacer section to be higher than the lens surface (optical surface A) on either the front surface or back surface of the lens.

As illustrated in a combining step of the image capturing element module of FIG. 4(b), after the cutting of the lens wafer module 6, the cut lens module 60 is adhered to an image capturing element unit 80, which is individualized from the image capturing element wafer unit 8, by matching the positions of the lens and the image capturing element. Further, a light shielding holder (not shown) covers the lens module 60 from the side to complete the image capturing element module. The removal of the surface-protecting tape 9b may be performed either before or after the adhering.

Next, as described with reference to FIGS. 4(a) and 4(b), instead of the case where the lens wafer module 6 is individualized to manufacture the lens module and the image capturing element wafer unit 8 is individualized to combine the lens module, the case where the first lens wafer 65 and the second lens wafer 66 are individualized to manufacture the first lens 61 and the second lens 62 and the image capturing element wafer unit 8 is individualized to combine the first lens 61 and the second lens 62 will be described.

Figure 5:
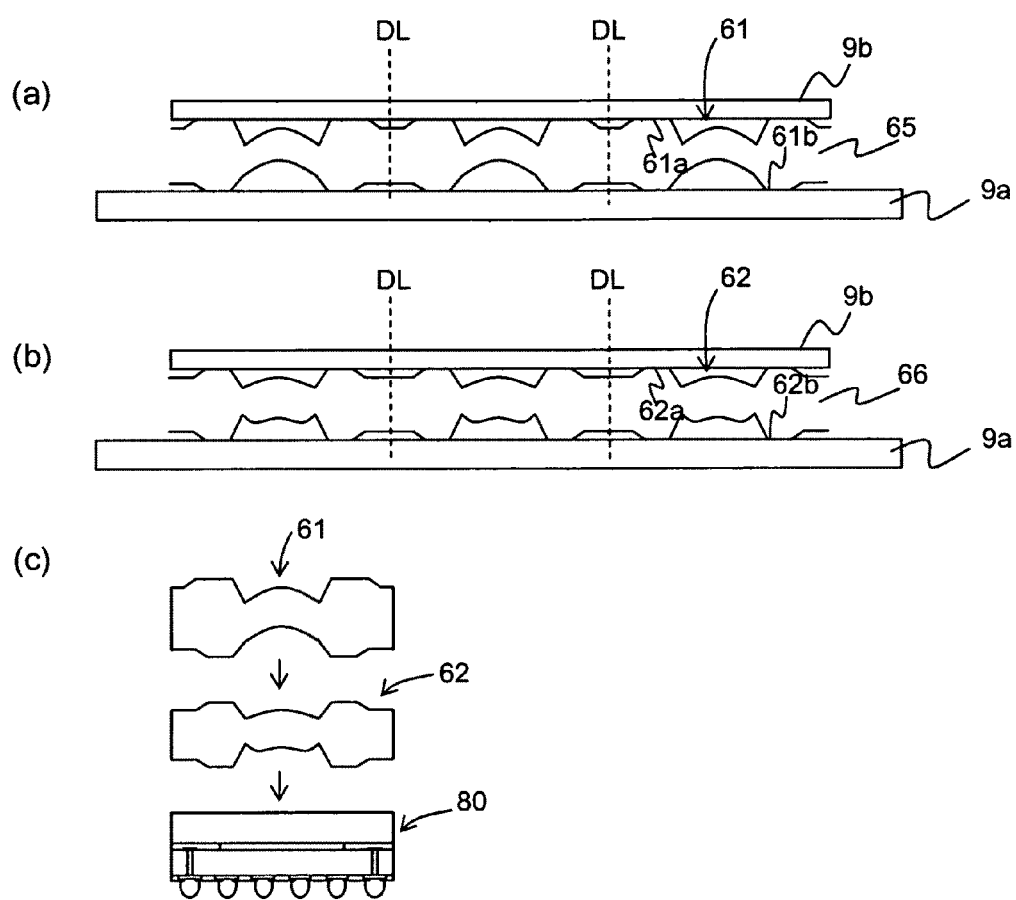
FIGS. 5(a) to 5(c) are each an essential part cross sectional view illustrating each manufacturing step for forming a first lens and a second lens, which are formed by cutting and individualizing a first lens wafer and second lens wafer of FIG. 1, and individualizing an image capturing element unit to be integrated with the first lens and second lens.

As illustrated in a cutting step of the first lens wafer 65 of FIG. 5(a), the first lens wafer 65, in which the plurality of first lenses 61 are formed at the wafer scale, is simultaneously cut along the dicing lines DL to manufacture the first lens 61 illustrated in FIG. 5(c). During the cutting stage, the cut-securing tape 9a is adhered to the planarized surface of the annular protruded section 61b on the outer circumference side back surface side of the plurality of first lenses 61 of the first lens wafer 65, and the surface-protecting tape 9b is adhered to the planarized surface of the annular protruded section 61a on the outer circumference front surface side of the first lenses 61 of the first lens wafer 65. As a result, during the cutting stage, each optical surface of the first lenses 61 is sealed and protected by the cut-securing tape 9a and the surface-protecting tape 9b, and each optical surface of the plurality of first lenses 61 does not become dirty from cutting water. However, there is also a method for cleaning the optical surface A by spin cleaning without adhering the surface-protecting tape 9b but maintaining the cut-securing tape 9a on the lens after the cutting. Thus, the adhering of the cut-securing tape 9a is essential, but the adhering of the surface-protecting tape 9b is not essential. It is possible to clean the lens surface by spin cleaning without using the surface-protecting tape. Therefore, it is suitable for the spacer section to be higher than the lens surface (optical surface A) on either the front surface or back surface of the lens.

Similarly, as illustrated in a cutting step of the second lens wafer 66 of FIG. 5(b), the second lens wafer 66, in which the plurality of second lenses 62 are formed at the wafer scale, is simultaneously cut along the dicing lines DL to manufacture the second lens 62 illustrated in FIG. 5(c). During the cutting stage, the cut-securing tape 9a is adhered to the planarized surface of the annular protruded section 62b on the outer circumference side back surface side of the plurality of second lenses 62 of the second lens wafer 66, and the surface-protecting tape 9b is adhered to the planarized surface of the annular protruded section 61a on the outer circumference front surface side of the second lenses 62 of the second lens wafer 66. As a result, during the cutting stage, each optical surface of the second lenses 62 is sealed and protected by the cut-securing tape 9a and the surface-protecting tape 9b, and each optical surface of the plurality of second lenses 62 does not become dirty from cutting water. However, there is also a method for cleaning the optical surface A by spin cleaning without adhering the surface-protecting tape 9b but maintaining the cut-securing tape 9a on the lens after the cutting. Thus, the adhering of the cut-securing tape 9a is essential, but the adhering of the surface-protecting tape 9b is not essential. It is possible to clean the lens surface by spin cleaning without using the surface-protecting tape. Therefore, it is suitable for the spacer section to be higher than the lens surface (optical surface A) on either the front surface or back surface of the lens.

As illustrated in a combining step of the image capturing element module of FIG. 5(c), after the cutting of the first lens wafer 65 and the second lens wafer 66, the cut first lens 61 and second lens 62 are adhered in this order from the top to the image capturing element unit 80, which is individualized from the image capturing element wafer unit 8, by aligning the lens position and the position of the image capturing element 2. Further, a light shielding holder (not shown) covers the first lens 61 and second lens 62 from the side to complete the image capturing element module. The removal of the surface-protecting tape 9b may be performed either before or after the adhering.

The lens module 60 and the image capturing element unit 80 of good quality are adhered to each other, so that there will be little influence on the cost, since the products of good quality are combined even if the overall quality rate is low in either of the products.

According to Embodiment 1 with the structure described above, the two, first and second lenses 61 and 62 are provided. Further, the optical surface A is provided as a lens area at the center portion of the first lens 61, for example; and the protruded sections 61a and 61b are provided as a spacer section with a predetermined thickness, on the outer circumference side of the optical surface A. In the image capturing element module (sensor module 10) using the modularized first lenses 61 and 62, the adhesive 7 is positioned only in the space portion surrounded by the bottom portions 61e and 62e provided with the tapered sections 61d and 62d interposed therebetween, on the further outer circumference side of the planarized surface of the spacer section, but the adhesive 7 is at least not positioned in the space portion made by the tapered sections 61d and 62d. A space large enough for the adhesive 7 to be pressed and spread when adhering is provided at least by the space portion made by the tapered sections 61d and 62d. As a result, there will be no interposition of the adhesive 7 as done conventionally, so that the lens space or the space between the lens and the image capturing element will be stabilized without variations therebetween, and the optical characteristics will be suitable.

Furthermore, at the position higher than a high position at a center portion of a convex lens surface of the first lens 61 on the opposite side from the image capturing element 2 side, the annular top planarized surface (planarized surface of the annular protruded section 61a) of a peripheral flange portion on the outer circumference side of the convex lens surface is provided. Conventionally, a force is applied to a cut-securing tape 9 in the direction of peeling off the adhered cut-protecting tape from the convex lenses. Alternatively, according to the specification of the present application, the cut-securing tape 9 is adhered to the top planarized surface (planarized surface of the annular protruded section 61a) of the peripheral flange, so that no stress is applied to the cut-protecting tape 9. As a result, it becomes difficult for the cut-securing tape 9 to be peeled off, the adhesive of the cut-securing tape 9 does not adhere on the convex lens surface, and the cutting water does not penetrate the cut-protecting tape 9 to make the convex lens surface dirty. This can be achieved as long as the top planarized surface (planarized surface of the annular protruded section 61a) of the peripheral flange on the outer circumference side is higher than at least the convex lens surface of the upper most first lens 61. Thus, it is suitable for the top planarized surface (planarized surface of the annular protruded section 61a) of the peripheral flange (spacer section) on the outer circumference side to be higher than at least the convex lens surface of the upper most first lens 61. That is, it is suitable for the top planarized surface (planarized surface of the annular protruded section) of the peripheral flange (spacer section) on the outer circumference side to be higher than the lens surface (optical surface A) on at least either the front surface or back surface of the lens.

Figure 6:
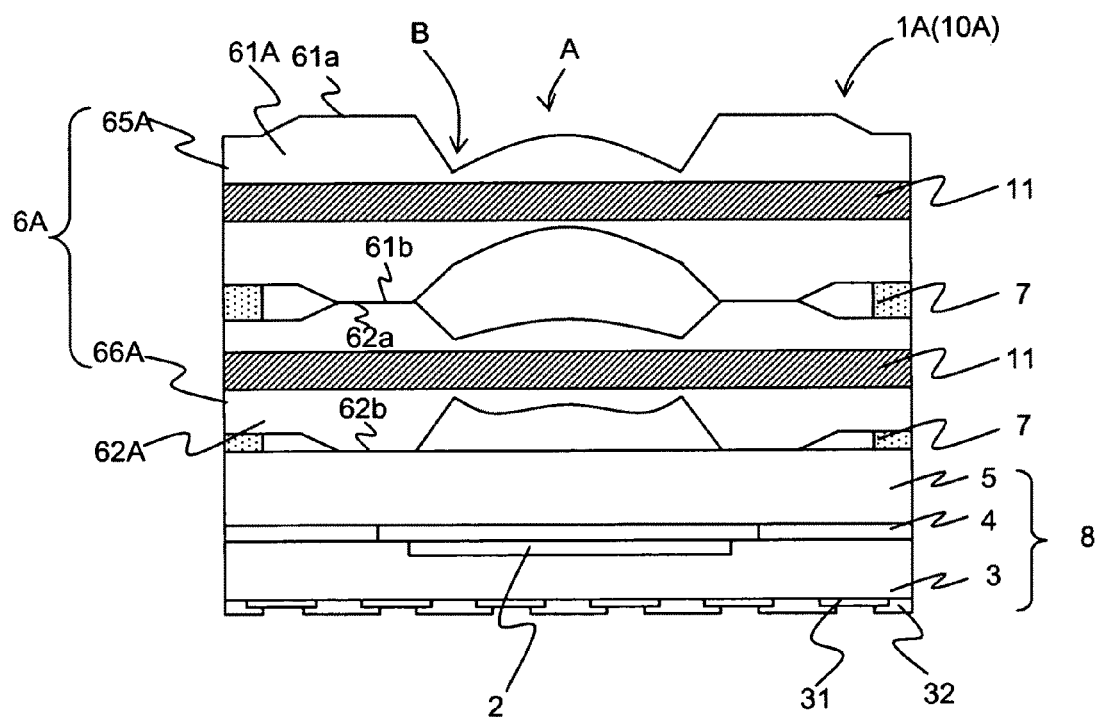
FIG. 6 is an essential part longitudinal cross sectional view illustrating an exemplary variation of the image capturing element wafer module of FIG. 1.

As illustrated in FIG. 6, a lens wafer module 6A is modularized with the image capturing element wafer unit 8 as an image capturing element wafer module 1A, an exemplary variation of the image capturing element wafer module 1 of Embodiment 1. A transparent support plate 11, which is formed of a transparent glass or resin plate, is provided in each of the first lens wafer 65 and the second lens wafer 66 so that a first lens wafer 65A, in which a plurality of first lenses 61A, and a second lens wafer 66A, in which a plurality of second lenses 62A, are structured; and as the lens wafer module 6A is configured by laminating the first lens wafer 65A on top of the second lens wafer 66A. Each of the first lens wafer 65A and the second lens wafer 66A is structured in such a manner to form a lens front surface shape and a lens back surface shape on the front and back surfaces of the transparent support plate 11 respectively. Similar to the case of FIG. 1, FIG. 6 illustrates one unit of an image capturing element module of the image capturing element wafer module 1A, and in an actual condition, a large number of the unitary image capturing element modules are provided and the large number of image capturing element modules (sensor modules 10A) are individualized by the cutting of the image capturing element wafer module 1A.

A method for manufacturing the first lens wafer 65A and the second lens wafer 66A of the lens wafer module 6A will be described with reference to FIGS. 7(a) to 7(c).

Figure 7:
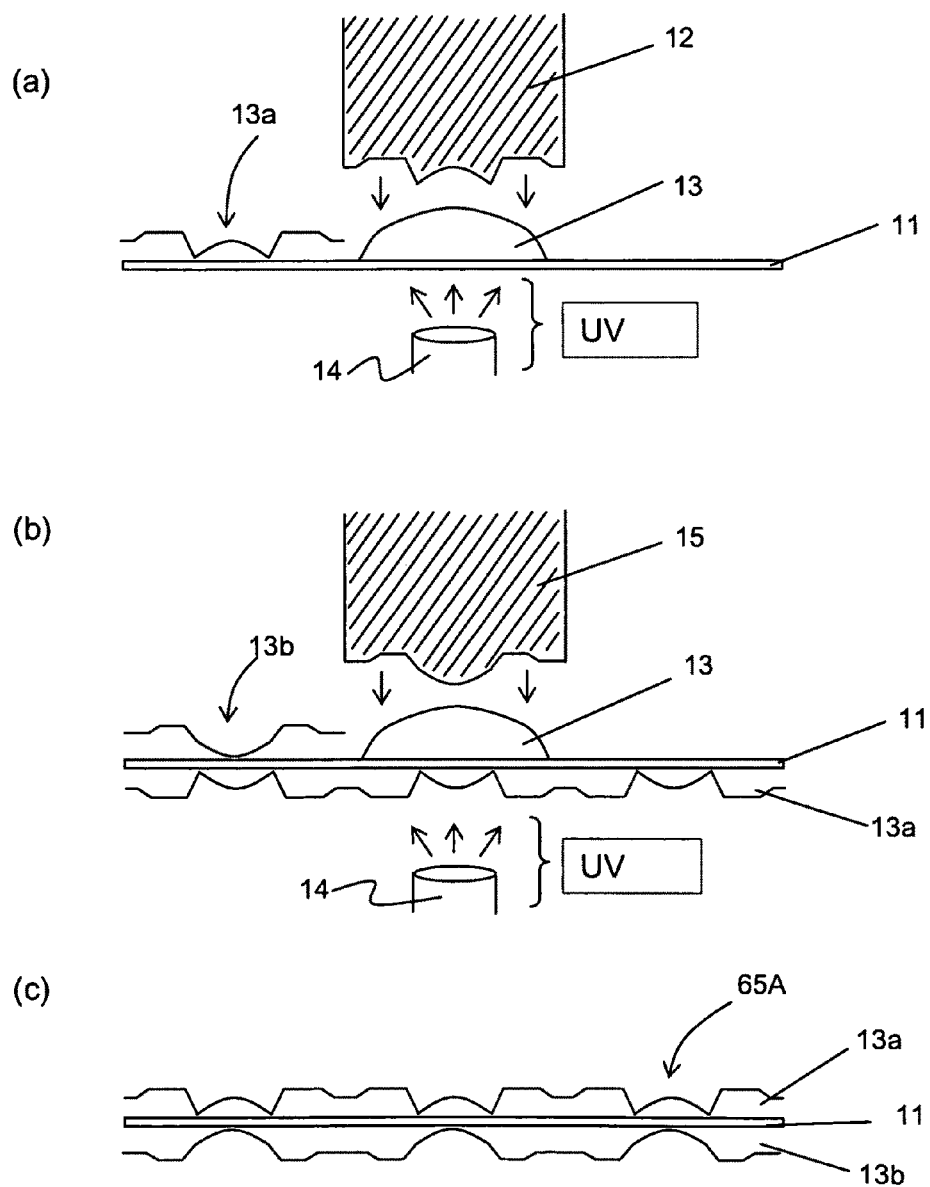
FIGS. 7(a) to 7(c) are each an essential part longitudinal cross sectional view illustrating each manufacturing step of a method for manufacturing a first lens wafer of a lens wafer module of FIG. 6.

As illustrated in FIG. 7(a), a metal mold 12, which matches a first lens front surface shape 13a, is prepared. A lens-forming transparent resin 13 is applied on the front surface side of the transparent support plate 11. The metal mold 12 is pressed on the lens-forming transparent resin 13 to transfer the first lens front surface shape 13a. Subsequently, ultraviolet rays (UV) from an ultraviolet ray (UV) irradiation device 14 are irradiated to the lens-forming transparent resin 13 from the bottom through the transparent support plate 11 to cure the lens-forming transparent resin 13. This process is repeated a number of times at equal pitch to arrange the plurality of first lens front surface shapes 13a on the transparent support plate 11 at the wafer scale. The amount of the lens-forming transparent resin 13 should be controlled accurately so that adjacent shapes can be properly adjusted with each other. In this case, it is appropriate as long as the planarized surface of the annular protruded section 61a of the first lens 61 on the outer circumference of the first lens front surface shape 13a is formed accurately. Even if the outside of the planarized surface is not adjusted, if an escape portion (concave portion) is formed, there will not be a problem because an expansion of the resin will not occur.

Next, as illustrated in FIG. 7(b), a metal mold 15, which matches a first lens back surface shape 13b, is prepared. Turning the back surface side of the transparent support plate 11 up, the lens-forming transparent resin 13 is applied on the opposite surface side of the formally processed first lens front surface shape 13a. The metal mold 15 is pressed on the lens-forming transparent resin 13 to transfer the first lens back surface shape 13b. Subsequently, ultraviolet rays (UV) are irradiated to the lens-forming transparent resin 13 from the bottom through the transparent support plate 11 and the first lens front surface shape 13a thereon to cure the lens-forming transparent resin 13. This process is repeated a number of times at equal pitch to arrange the plurality of first lens back surface shapes 13b on the transparent support plate 11 at the wafer scale. In this case as well, the amount of the lens-forming transparent resin 13 should be controlled accurately so that adjacent shapes can be properly adjusted with each other. In this case, it is appropriate as long as the planarized surface of the annular protruded section 61b of the first lens 61 on the outer circumference of the first lens back surface shape 13b is formed accurately. Even if the outside of the planarized surface is not adjusted, if an escape portion (concave portion) is formed, there will not be a problem because an expansion of the resin will not occur.

Although not shown, it is also possible to prepare a plural number of metal molds and press the plurality number of metal molds simultaneously on the lens-forming transparent resin 13 to simultaneously form the plurality of first lens front surface shapes.

As a result, the front surface shape of the first lens is formed on the front surface of the transparent support plate 11 and the back surface shape of the first lens is formed on the back surface of the transparent support plate 11.

As another example of the transparent support plate 11, the case where a lens wafer is manufactured with a lens support plate having a through hole penetrating only a lens shape area, will be described in detail in Embodiment 2.

(Embodiment 2)

Figure 8:
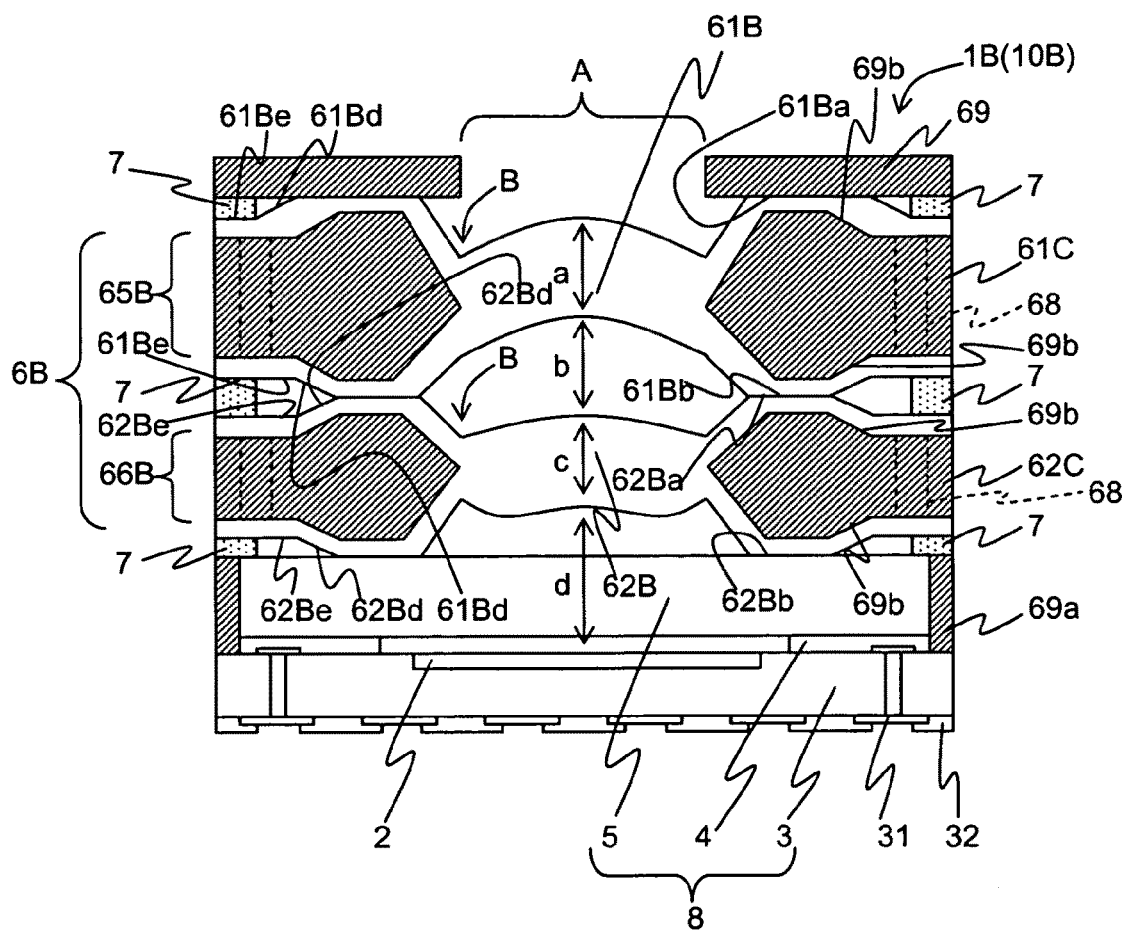
FIG. 8 is an essential part longitudinal cross sectional view illustrating an exemplary structure of an electronic element wafer module according to Embodiment 2 of the present invention.

FIG. 8 is an essential part longitudinal cross sectional view illustrating an exemplary unitary structure of an electronic element wafer module according to Embodiment 2 of the present invention.

In FIG. 8, an image capturing element wafer module 1B as the electronic element wafer module of Embodiment 2 includes: a plurality of image capturing elements 2 arranged in a matrix, the image capturing elements 2 including a plurality of light receiving sections for performing a photoelectric conversion on and capturing an image of image light from a subject; an image capturing element wafer 3, as an electronic element wafer, in which a penetrating electrode is provided for each image capturing element 2; a resin adhesion layer 4 formed on the image capturing element wafer 3 and in between adjacent image capturing elements 2; a transparent support substrate 5, such as a glass plate, adhered and fixed on the resin adhesion layer 4; and a lens wafer module 6B, as an optical element wafer module, provided such that lens positions correspond to the plurality of respective image capturing elements 2. FIG. 8 illustrates a single unit image capturing element module of the image capturing element wafer module 1B, and in an actual condition, a large number of the unitary image capturing element modules are provided and the large number of image capturing element modules are individualized by the cutting of the image capturing element wafer module 1B.

The image capturing element wafer 3 includes a large number of the image capturing elements 2 in a matrix on the front surface side (a plurality of light receiving sections, which constitute a plurality of pixels, are provided for each image capturing element 2), and a plurality of through holes penetrating a wafer back surface to below a pad (electrode pad) of a front surface for each image capturing element 2. A side wall and back surface of each of the through holes are covered with an insulation film, and a wiring layer contacting the pad is formed to the back surface through the through hole. An insulation film 32 is formed on an external connection terminal 31, which is connected to the wiring layer, and on the back surface. The insulation film 32 has an opening at a portion where a solder ball (not shown) is formed above the external connection terminal 31 of the wiring layer, so that the solder ball (not shown) is formed exposed to the outside. Herein, a case has been described where the image capturing element wafer 3 includes a penetrating electrode for each image capturing element 2; however there is also a case where such penetrating electrode is not included.

The resin adhesion layer 4 is formed in the periphery part of the image capturing element 2 on the wafer surface to adhere the image capturing element wafer 3 and the transparent support substrate 5. When the upper part of the semiconductor surface is covered by the transparent support substrate 5, the resin adhesion layer 4 encloses an internal space above a sensor area where the image capturing element 2, as an electronic element, above the image capturing element wafer 3 is provided. The resin adhesion layer 4 is formed at a predetermined location on the image capturing element wafer 3 using an ordinary photolithography technique. The transparent support substrate 5 is adhered on the resin adhesion layer 4. In this case, the resin adhesion layer 4 can also be formed using a screen printing method or a dispense method, other than the photolithography technique.

The lens wafer module 6B includes a first lens wafer 65B and a second lens wafer 66B laminated on the transparent support substrate 5 in such a manner to correspond to the image capturing element 2. The first lens wafer 65 is constituted of a plurality of first lenses 61B. The second wafer 66 is constituted of a plurality of second lenses 62B. An optical surface A of the first lens 61B is in a shape of a convex lens and is externally protruded. The outer circumference portion of the optical surface A is annularly protruded more than the most-protruded top portion at the center portion of the optical surface A. In FIG. 8, annularly protruded sections 61Ba and 61Bb of the optical surface A are illustrated as a planarized surface in the first lens 61B; however, without the limitation to the annular planarized surface, any shape can be included, such as a circular arc protruded section or a wavy shape with circular arc protruded sections arranged on one column, as long as it is an annular protruded section.

In the second lens 62B, both the front surface and the back surface are a convex shaped optical surface A, and protruded sections 62Ba and 62Bb are annularly protruded from an outer circumference end portion B, which is the outer circumference of the optical surface A, and are higher than the convex shape of the optical surface A, and the top surface is a planarized surface. The annular protruded section 61Bb, which is on the outer circumference side of the optical surface A on the back surface of the first lens 61B, and the annular protruded section 62Ba, which is on the outer circumference side of the optical surface A on the front surface of the second lens 62B, contact with each other at the respective planarized surfaces. An adhesive 7 is provided in a space made by bottom portions 61Be and 62Be (lower portions or step portions) further outside of the annular protruded sections 61Bb and 62Ba. The first lens 61B and the second lens 62B are vertically adhered and fixed to each other at the space in between them by the adhesive 7. Similar to this, the transparent support substrate 5 and the annular protruded section 62Bb at the outer circumference end portion B of the optical surface A on the back surface contact each other at the respective planarized surfaces. The adhesive 7 is provided in the space made by the bottom portions 61Be and 62Be on the further outside of the annular protruded section 62Bb. The transparent support substrate 5 and the second lens 62B are vertically adhered and fixed to each other at the space in between them by the adhesive 7.

Because of the structure described above, the space between the first lens 61B and the second lens 62B as well as the space between the second lens 62B and the transparent support substrate 5 touch each other and are regulated by the respective planarized surfaces of the annular protruded sections 61Bb and 62Ba and the annular protruded section 62Bb. As a result, there is no negative influence created by the variation due to the thickness or amount of the adhesive 409. As a result, the lens space becomes stable. That is, the space between the lenses are determined by the contacting surfaces (protruded sections 61Bb, 62Ba and 62Bb) of the first lens 61 and the second lens 62, and the adhesion is made by the adhesive 7 in the space portion (gap portion) made by the bottom portions 61Be and 62Ba further outside the contacting surfaces. Therefore, even if the amount of the adhesive 7 is too much, the adhesive 7 only spreads within the gap portion, and the variation of the thickness or amount of the adhesive 7 does not cause a problem. As a result, the lens space becomes stable, and further, the optical characteristics of the lens module 6B become stable.

Thus, the contacting surface of the first lens wafer 65B and the contacting surface of the second lens wafer 66B directly contact each other, and the contacting surface of the second lens wafer 66B and the transparent support substrate 5 directly contact each other, so as to adhere them at the gap portions of the outer circumference portions. As a result, the first lens wafer 65B and the second lens wafer 66B can be manufactured with high precision, so that a lens space b and a space d between the lens and the image capturing element 2 do not vary. In this case, the adhesive 7 is provided only in a space portion (gap portion) made by the bottom portions 61Be and 62Be on the further outer circumference side of the lens contact surface. The adhesive 7 does not fill the space portion (gap portion) made by the bottom portion 61Be and 62Be (step portion), but the adhesive 7 is provided in the space portion (gap portion) in such a manner to leave a partial space therein, so that the adhesive 7 only spreads within the space and will not reach the protruded section 61Bb, 62Ba or 62Bb even if there is too much adhesive 7, and a variation in the thickness or amount of the adhesive 7 does not cause a problem. As a result, the lens space becomes stable, and the optical characteristics of the lens module 6 become stable.

That is, the adhesive 7 is positioned only in all or part of the space portion surrounded by upper and lower bottom portions 61Be and 62Be provided with upper and lower tapered sections 61Bd and 62Bd interposed therebetween; on the further outer circumference side of the respective planarized surfaces of the protruded section 61Bb of the upper optical element wafer 65 and the protruded section 62Ba of the lower optical element wafer 66, so as to adhere the upper optical element wafer 65 and the lower optical element wafer 66. Thus, the adhesive 7 is positioned only in all or part of the space portion made by the upper and lower bottom portions 61Be and 62Be, but the adhesive 7 is not positioned in the space portion made by the upper and lower tapered sections 61Bd and 62Bd. Therefore, when adhering, a space larger enough for the adhesive 7 to be pressed from the top and bottom and spread by the upper optical element wafer 65 and the lower optical element wafer 66 is provided by the space portion made by the upper and lower tapered sections 61Bd and 62Bd.

Further, the adhesive 7 is positioned only in the space portion surrounded by the bottom portion 62Be, which is provided with the tapered section 62Bd interposed therebetween on the further outer circumference side of the planarized surface of the protruded section 62Bb of the lowermost optical element wafer 66, and the transparent support substrate 5, so as to adhere the lower most optical element wafer 66 and the transparent support substrate 5. Thus, the adhesive 7 is only provided in the space portion made by the bottom portion 62Be, but the adhesive 7 is not provided in the space portion made by the tapered section 62Bd; and when adhering, a space large enough for the adhesive 7 to be pressed from the top and bottom and spread by the lower most optical element wafer 62 and the transparent support substrate 5 is provided by the space portion made by the tapered section 62Bd.

The lens space b and the space d between the lens and the image capturing element 2 in this case vary largely due to the thickness of the adhesive 7 because the adhesive 7 is put between the first lens wafer 65B and the second lens wafer 66B, and the adhesive 7 is put between the second lens wafer 66B and the upper surface of the transparent support substrate 5, as conventionally performed. For example, when an adhesive sheet with the adhesive 7 of the thickness of 50 μm is used, the variation will be plus or minus 10 μm. When the adhesive 7 is in a liquid form, the variation will be greater at the application of the adhesive 7.

Further, at the time of the conventional reflow soldering (soldering process at 250 degrees Celsius), when the internal enclosed space between the lenses expands, there is no escape route for inside air. Because of this, the first lens wafer 65B and the second lens wafer 66B with the adhesive 7 interposed therebetween, and the second lens wafer 66B and the transparent support substrate 5 are peeled off, in addition to the image capturing element wafer 3 and the transparent support substrate 5 with the resin adhesion layer 4 interposed therebetween. In order to solve this problem, the resin adhesion layer 4 and the adhesive 7 are formed in such a manner not to surround the circumference completely but to provide an air hole (vent).

Figure 9:
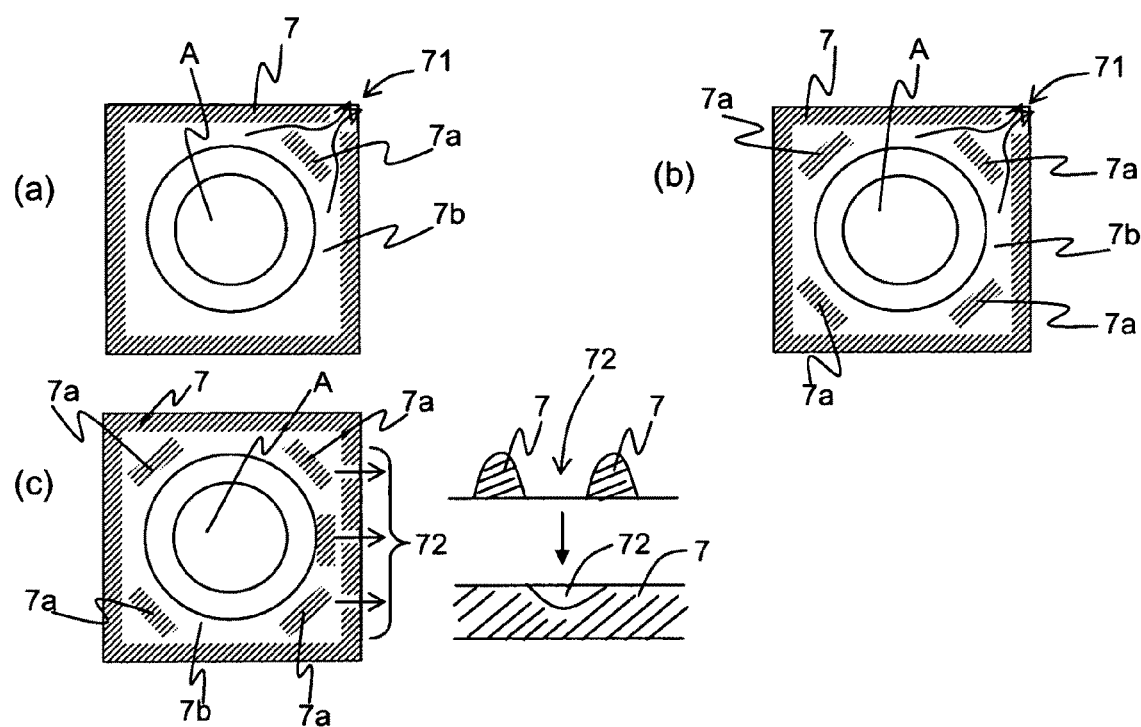
FIGS. 9(a) to 9(c) are each a plan view schematically illustrating each example of an adhesive positioning structure when a vent is provided at a part of an adhesive in FIG. 8, which does not entirely surround the outer circumference of the electronic element wafer.
Figure 10:
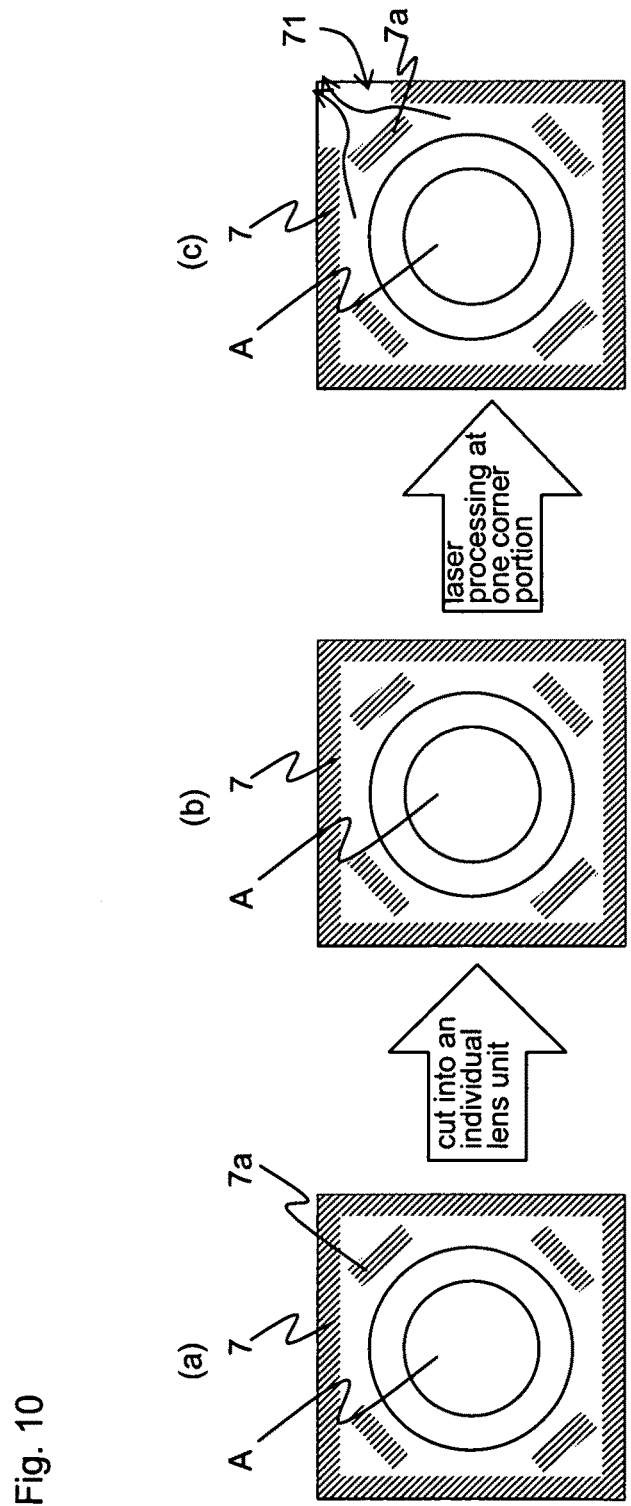
FIGS. 10(a) to 10(c) are each a plan view schematically illustrating other examples of an adhesive positioning structure when a vent is provided at a part of an adhesive in FIG. 8, which does not entirely surround the outer circumference of the electronic element wafer.

FIGS. 9(*a*) to 9(*c*) and FIG. 10 describe such an example.

In FIG. 9(*a*), the adhesive 7 is provided along the four sides up to the dicing line DL on the outer circumference side of the lens optical surface A. In this case, a part of the adhesive 7 in a quadrilateral shape with a predetermined width is removed to form a vent 71 for ventilation with the inside. An adhesive 7*a* is positioned inside the space formed with the adhesive 7, facing the opening made by removing a corner portion. Positioning the adhesive 7*a* facing the opening (vent 71) will prevent dust from coming from the outside to a space portion 7*b* inside the lens optical surface A. With the adhesive 7*a* alone, which is positioned facing the opening (vent 71), it is possible to adhere and capture dust by allowing the adhesive 7*a* to be cohesive even after the curing of the resin.

In FIG. 9(*b*), the vent 71 is formed at one corner portion of the adhesive 7 in a quadrilateral shape with a predetermined width, and at four corner portions, four adhesives 7*a*, which are cohesive even after the curing of the resin, are provided for capturing dust facing the corner portions. As a result, the performance for capturing dust is improved due to the increased number of the adhesives 7*a*.

In FIG. 9(*c*), a plurality of narrow vents 72 (three vents herein) are formed at least at one side of the adhesive 7 in a quadrilateral shape with a predetermined width. Again, three adhesives 7*a*, which are cohesive even after the curing of the resin, are provided for capturing dust, facing the respective vents inside the space. Furthermore, two adhesives 7*a* are provided at the rest of the two corner portions. As a result, the performance for capturing dust is improved due to the increased number of the adhesives 7*a*. The vent 72 itself is formed as small as possible so as to prevent the penetration of the cutting water. It is also possible to apply the adhesive 7 in a mountain shape and define a gap between the mountains as the vent 72. In addition, it is also possible to form the vent 72 in the adhesive 7 by reducing the amount of the adhesive 7.

In FIG. 10, in order to prevent the cutting water from penetrating the space portion 7*b* inside the lens optical surface A, the process for a air passing hole (vents 71 and 72, for example) of the lens is performed after the cutting of the individual lens unit, instead of performing it at the application of the adhesive 7 or 7*a* as in FIGS. 9(*a*) to 9(*c*). In FIG. 10(*a*), the adhesive 7 is applied to all the circumference portions of the lens optical surface A in a quadrilateral shape along the four sides using a dispensing method. The adhesive 7*a* for capturing dust, which is cohesive even after the curing of the resin, is applied inside the adhesive 7 in a quadrilateral shape and outside the lens optical surface A, facing each of the corner portions.

Subsequently, In FIG. 10(*b*), the adhesive 7 is applied in a quadrilateral shape, and the resin curing process is performed on the adhesive 7 by the ultraviolet ray (UV) radiation. Further, the cutting process for the individual lens units is performed.

Further, in FIG. 10(*c*), a cutting process is performed on one corner portion of the quadrilateral adhesive 7 using laser light to form the vent 71 as an air passing hole.

That is, in a plan view, the adhesive 7 is provided at a predetermined width outside the lens area (lens optical surface A) and inside the quadrilateral along the dicing line. The vent 71 and/or 72 are provided at least at one corner portion and/or one side portion of the four corner portions and four side portions of the quadrilateral adhesive 7. Furthermore, in a plan view, the adhesive 7*a* for capturing dust, which is cohesive even after the curing of the resin, is provided outside the lens area and inside the quadrilateral along the dicing line. Part or all of the adhesive 7*a* for capturing dust is provided in such a manner to face the vent 71 and/or 72 in the space portion 7*b* inside the outer vent in a plan view.

Alternatively, a lens support plate 61C is provided inside the transparent lens material of each first lens 61B of the first lens wafer 65B. The lens support plate 61C includes a through hole penetrating only a lens shape area, which is the lens optical surface A of a convex shape. Further, a lens support plate 62C is provided inside the transparent lens material of each second lens 62B of the second lens wafer 66B. The lens support plate 62C includes a through hole penetrating only a lens shape area, which is the lens optical surface A of a convex shape.

In this case, for the shielding of light for the image capturing element 2 from above, a light shielding plate 69 having an opening (window) above the lens optical surface A is provided by being adhered by the adhesive 7 on the front surface side of each first lens 61B of the first lens wafer 65B. Further, the shielding of light for the image capturing element 2 from the side is performed by the lens support plates 61C and 62C. The lens support plates 61C and 62C include through holes penetrating only a lens shape area (area corresponding to the lens optical surface A). A taper is provided for the through hole. The outer circumference side of the through hole is configured to be thicker than the further outer circumference side. The circumference portion of the through hole is expanded so that it becomes difficult for the light from the side to pass it through, and a tapered section 69*b* is provided on the further outer circumference side. A light shielding material 69a is positioned on the side wall of the transparent support substrate 5. Carbon is mixed, to provide a light shielding function, in the adhesive 7 between the light shielding plate 69 and the first lens wafer 65, the adhesive 7 between the first lens wafer 65B and the second lens wafer 66B, and the adhesive 7 between the second lens wafer 66B and the transparent support substrate 5. These adhesives enable shielding of light from the image capturing element 2 in a more definite manner.

Next, the lens thicknesses a and c of the first lens wafer 65B and the second lens wafer 66B vary. This is because the transparent lens resin does not have a place to escape from the pressure of the metal mold. Therefore, when the amount of the transparent lens resin is high, the contact pressure becomes high and the lens thicknesses a and c also become thick. The peripheral portion of each through hole of the lens support plates 61C and 62C expands, and a through hole 68 is provided on the further outer circumference side. Because of the through hole 68, when the transparent lens resin material is put between the metal molds, the resin material will have a space to escape through the through hole 68 due to the pressure of the metal molds, and the contact pressure on the resin material will not become high during the forming of the resin. Because of this, it becomes possible to avoid the variation of the lens thicknesses a and c of the first lens wafer 65B and the second lens wafer 66B. Further, instead of or together with the through hole 68, a front portion of the trough hole 68 can be widened or recessed so that it also becomes possible to control the contact pressure to the resin material at the forming stage.

First, a method for forming the first lens wafer 65B in FIG. 8 will be described in detail with reference to FIGS. 11(a) to 11(c).

Figure 11:
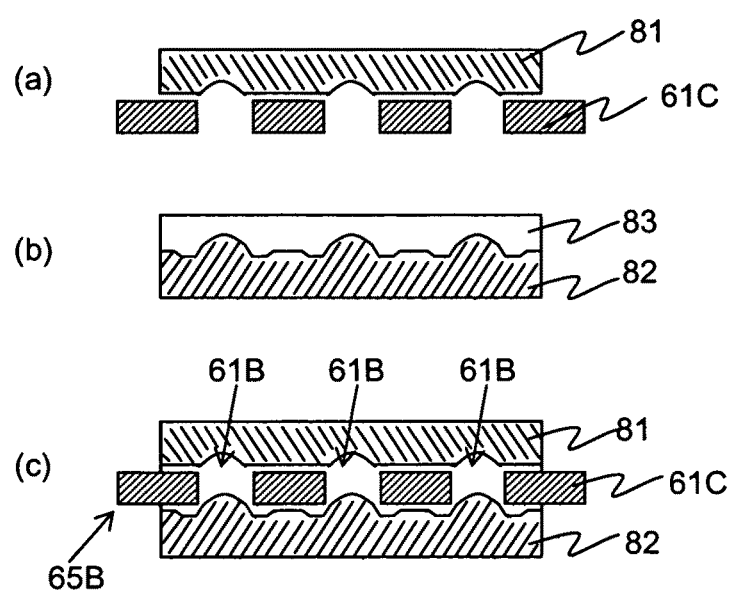
FIGS. 11(a) to 11(c) are each an essential part longitudinal cross sectional view for describing one example of a method for forming a first lens wafer of FIG. 8.

As illustrated in FIG. 11(a), the lens support plate 61C, which includes a plurality of through holes, is mounted on the lens front surface shape side of the upper metal mold 81 corresponding to the lens front surface shape of the first lens wafer 65B by positioning the lens support plate 61C such that the lens shape areas corresponds to the through holes.

Next, as illustrated in FIG. 11(b), a transparent resin material 83 is positioned on the lower metal mold 82 corresponding to the lens back surface shape of the first lens wafer 65B.

Further, as illustrated in FIG. 11(c), the lens support plate 61C and the transparent resin material 83 are put between and pressed by the upper metal mold 81, on which the lens support plate 61C is positioned, and the lower metal mold 82, on which the transparent resin material 83 is positioned, from the top and bottom. At this stage, the transparent resin material 83 of the first lens 61B is controlled so as to have a predetermined lens thickness. The formed transparent resin material 83 forms the first lens wafer 65B in which a plurality of first lens 61B are successively arranged in a two dimensional matrix at a wafer scale. Any of ultraviolet ray (UV) curing resin, thermosetting resin, and UV and heat curing resin can be used as the transparent resin material 83.

Next, another method for forming the first lens wafer 65B of FIG. 8 will be described in detail with reference to FIGS. 12(a) to 12(c).

Figure 12:
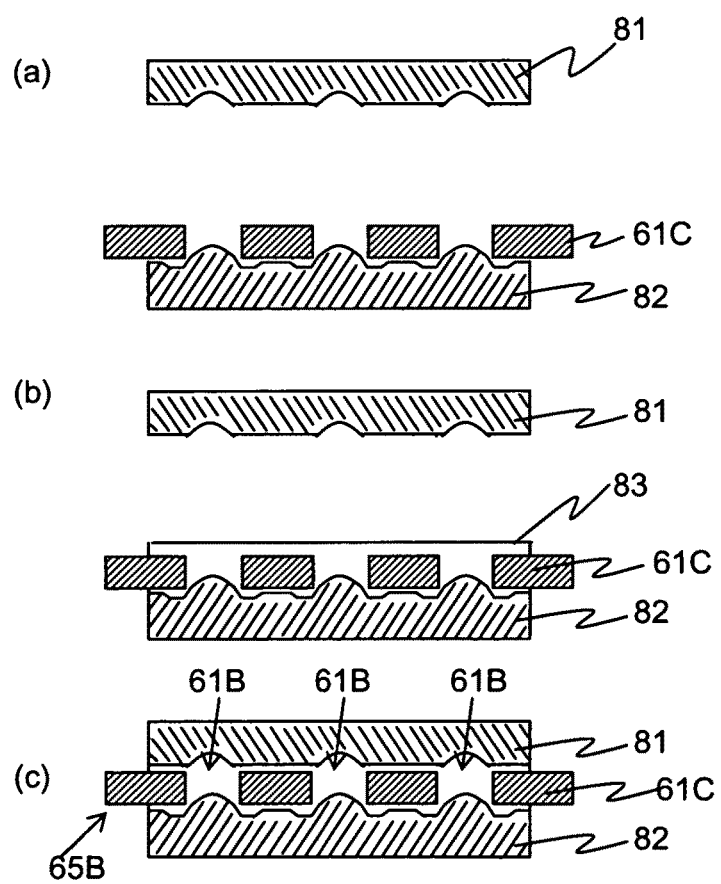
FIGS. 12(a) to 12(c) are each an essential part longitudinal cross sectional view for describing another example of a method for forming a first lens wafer of FIG. 8.

As illustrated in FIG. 12(a), the lens support plate 61C, which includes a plurality of through holes, is mounted on the lens back surface shape side of the lower metal mold 82 corresponding to the lens back surface shape of the first lens wafer 65B by positioning the lens support plate 61C such that the lens shape areas corresponds to the through holes.

Next, as illustrated in FIG. 12(b), the transparent resin material 83 is positioned on the lens support plate 61C on the lower metal mold 82 corresponding to the lens back surface shape of the first lens wafer 65B.

Further, as illustrated in FIG. 12(c), the lens support plate 61C and the transparent resin material 83 are put between and pressed by the upper metal mold 81 and the lower metal mold 82, on which the lens support plate 61C and the transparent resin material 83 are positioned, from the top and bottom. At this stage, the transparent resin material 83 of the first lens 61B is controlled so as to have a predetermined lens thickness. The formed transparent resin material 83 forms the first lens wafer 65B in which a plurality of first lens 61B are successively arranged in a two dimensional matrix at a wafer scale. Any of ultraviolet ray (UV) curing resin, thermosetting resin, and UV and heat curing resin can be used as the transparent resin material 83.

Next, another method for forming the first lens wafer 65B will be described in detail with reference to FIGS. 13(a) and 13(b).

Figure 13:
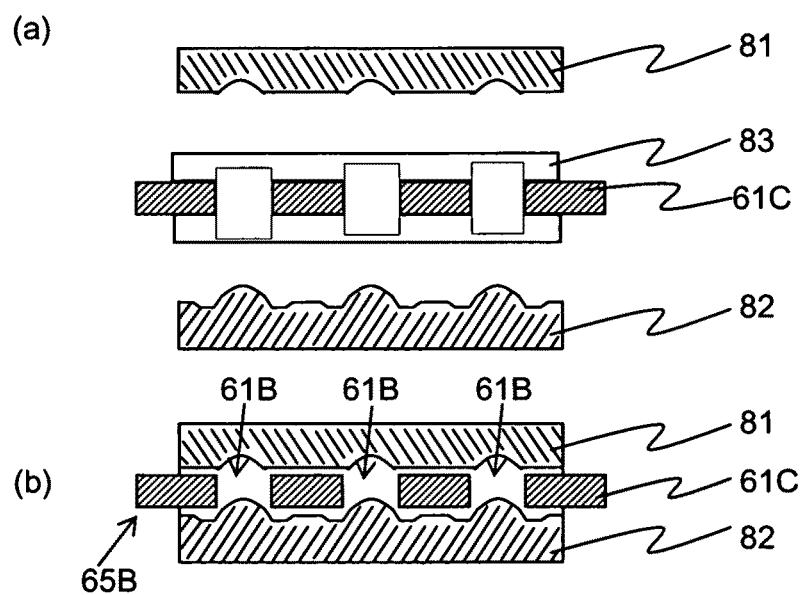
FIGS. 13(a) and 13(b) are each an essential part longitudinal cross sectional view for describing still another example of a method for forming a first lens wafer of FIG. 8.

As illustrated in FIG. 13(a), the transparent resin material 83 is applied and positioned on the lens support plate 61C, which includes a plurality of through holes.

Next, as illustrated in FIG. 13(b), in a state where the lens shape area and the through hole are positioned corresponding to each other, the lens support plate 61C, on which the transparent resin material 83 is applied, is put between and pressed by the upper metal mold 81 corresponding to the lens front surface shape of the first lens wafer 65B and the lower metal mold 82 corresponding to the lens back surface shape of the first lens wafer 65B from the top and bottom. At this stage, the transparent resin material 83 of the first lens 61B is controlled so as to have a predetermined lens thickness. The formed transparent resin material 83 forms the first lens wafer 65B in which a plurality of first lens 61B are successively arranged in a two dimensional matrix at a wafer scale. Any of ultraviolet ray (UV) curing resin, thermosetting resin, and UV and heat curing resin can be used as the transparent resin material 83.

Again, in Embodiment 2 with the structure described above, the two, first lens 61B and second lens 62B are provided. Further, the optical surface A is provided as a lens area at the center portion of the first lens 61B, for example; and the protruded sections 61Ba and 61Bb are provided as a spacer section with a predetermined thickness, on the outer circumference side of the optical surface A. In the image capturing element module (sensor module 10B) using the modularized first lenses 61B and 62B, the adhesive 7 is positioned only in the space portion surrounded by the bottom portions 61Be and 62Be provided with the tapered sections 61Bd and 62Bd interposed therebetween, on the further outer circumference side of the planarized surface of the spacer section, but the adhesive 7 is at least not positioned in the space portion made by the tapered sections 61Bd and 62Bd. A space large enough for the adhesive 7 to be pressed and spread when adhering is provided at least by the space portion made by the tapered sections 61Bd and 62Bd. As a result, the overall thickness is not negatively influenced due to the interposition of the adhesive 7, as is negatively influenced conventionally, so that there will be no interposition of the adhesive 7 as done conventionally, and the lens space or the space between the lens and the image capturing element will be stabilized without variations therebetween, and the optical characteristics will be suitable.

Further, the surface height of the spacer section, which is provided on the outer circumference side of the optical surface A, functioning as an optical element area, is configured to be higher than the surface height of the optical surface A at the center portion functioning as an optical element area. As a result, in the manufacturing process, the lens optical surface A can be prevented from becoming dirty from cutting water and a lowering of the optical characteristics can be prevented. Furthermore, the surface of the optical element, such as a convex lens surface that functions optically, can be maintained clean.

(Embodiment 3)

In Embodiment 3, the lens as an optical element and the lens module as an optical element module will be described in detail.

FIG. 14(a) is a longitudinal cross sectional view illustrating an exemplary variation of each lens of FIG. 5(c). FIG. 14(b) is a longitudinal cross sectional view illustrating an exemplary variation of the lens module of FIG. 4(b). FIG. 14(c) is a top view of the first lens 61 of FIG. 5(c). FIG. 14(d) is a top view of the first lens of FIG. 14(a). FIG. 14(e) is a longitudinal cross sectional view of a lens module in which the first lens of FIG. 14(a) is combined with the light shielding holder. FIG. 14(f) is a longitudinal cross sectional view of a lens module in which the exemplary variation of the lens module of FIG. 14(b) is combined with the light shielding holder.

Similar to the case with the FIG. 5(a) and FIG. 5(b), it is possible to obtain a large number of first lenses 84 as well as second lenses 85 as illustrated in FIG. 14(a) by cutting the first and second lens wafers along the dicing lines DL. A spacer section with a predetermined thickness is provided at each of the outer circumference sides of the lens optical surface A at the center portion in the first and second lenses 84 and 85. As illustrated by the shaded portion of the outer quadrilateral and inner circle in the plan view in FIG. 14(d), the spacer section is a planarized section F1, which is protruded from the circular outer circumference portion B surrounding the optical surface A, the spacer section being higher than the convex shape of the optical surface A. In the first and second lenses 84 and 85, the optical surface A and the spacer section are simultaneously formed with a transparent resin material. In the first lens 61 of a quadrilateral in the plan view of FIG. 5(c), as illustrated by the annular shaded portion of FIG. 14(c), the spacer section is an annular protruded section F2, which is protruded from the circular outer circumference portion B surrounding the optical surface A, the protruded section F2 being protruded further than the convex shape of the optical surface A. Therefore, the difference between the first and second lenses 61 and 62 of FIG. 5(c) and the first and second lenses 84 and 85 of FIG. 14(a) is whether they have the annular protruded section F2 or planarized section F1 both on the front and back surfaces.

Further, a lens module 86 illustrated in FIG. 14(b) can be obtained by simultaneously cutting along the dicing lines DL in the state where the first lens wafer, in which a plurality of first lenses 84A are formed, and the second lens wafer, in which a plurality of second lenses 85A are formed, are adhered on top of another using the adhesive 7. Again, in the cutting stage, a cut-securing tape is adhered on the planarized section F1 of the lower second lens wafer, and a surface-protection tape for protecting the lens surface is adhered on the planarized section F1 of the upper first lens wafer, as similar to the cutting of the first lenses 84A and the second lenses 85A. As a result, during the cutting stage, the respective lens optical surfaces of the first and second lenses 84A and 85A are sealed and protected by the cut-securing tape and the surface-protecting tape, so that the lens optical surfaces do not become dirty from the cutting water. However, there is also a method for cleaning the optical surface A by spin cleaning without adhering the surface-protecting tape 9b but maintaining the cut-securing tape 9a on the lens after the cutting. Thus, the adhering of the cut-securing tape 9a is essential, but the adhering of the surface-protecting tape 9b is not essential. It is possible to clean the lens surface by spin cleaning without using the surface-protecting tape. Therefore, it is suitable for the spacer section to be higher than the lens surface (optical surface A) on either the front surface or back surface of the lens.

The difference between the lens module 86 illustrated in FIG. 14(b) and the lens module 60 of FIG. 4(b) is whether they have the annular protruded section F2 or planarized section F1 both on the front and back surfaces.

In this case, the annular planarized surface of the spacer section of the upper first lens 84A directly contacts with the annular planarized surface of the spacer section of the lower second lens 85A, and the adhesive 7 is provided in the space portion surrounded by the bottom portion on the further outer circumference side of each planarized surface, so that the first lens 84A is adhered to the second lens 85A.

Further, the first lens 84A, which is illustrated by a dashed line in FIG. 14(a), includes a planarized back surface and includes the optical surface A and the planarized section F1 on the front surface, the planarized section F1 being more protruded than the optical surface A. In this case, the first lens 84A and the second lens 85 are provided together as a set. Further, the first lens 84 and the second lens 85A illustrated by a dash line are provided as a set. Even if the optical surface A of the front surface of the second lens 85A is protruded, it fits in the concave portion of the back surface of the first lens 84. The optical surface A and the planarized section F1, which is more protruded than the optical surface A, are provided only on the back surface of the second lens 85A. Because of this, each lens optical surface A does not become dirty from the cutting water, as described above.

In summary, it is suitable as long as the optical surface A and the more protruded, protruded section F2 or planarized section F1 are provided at least on either of the front surface or the back surface.

Further, as illustrated in FIG. 14(e), a lens module 88 can be configured by installing the first lens 84B in a light shielding holder 87. Further, as illustrated in FIG. 14(f), a lens module 89 can be configured by installing a lens module 86A, which is configured of the first lens 61 of FIG. 4(b) and the second lens 85A of FIG. 14(b), in the light shielding holder 87. Thus, the lens and the light shielding holder 87 are provided as a set to configure a lens module.

Figure 14:
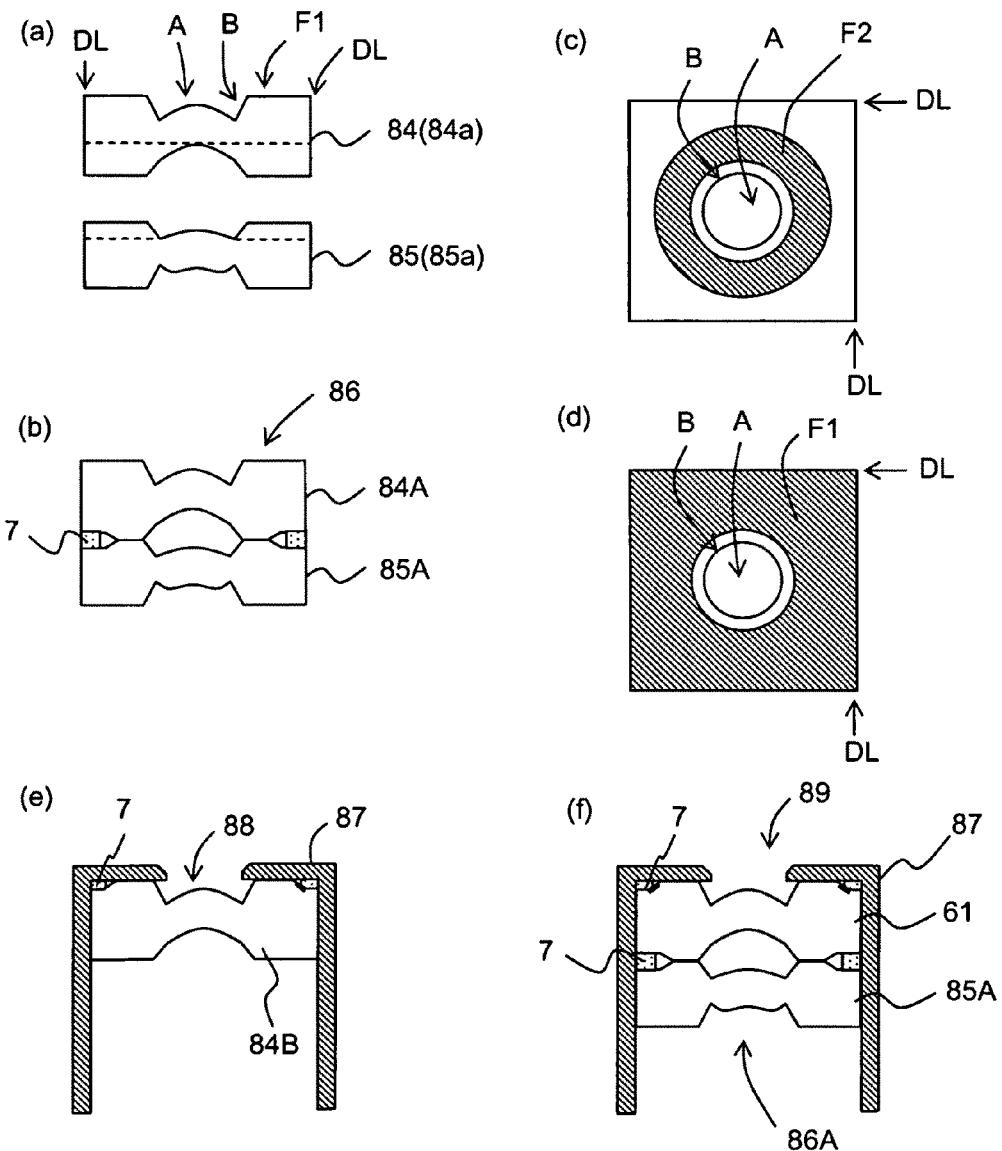
FIG. 14(a) is a longitudinal cross sectional view illustrating an exemplary variation of each lens of FIG. 5(c).
FIG. 14(b) is a longitudinal cross sectional view illustrating an exemplary variation of a lens module of FIG. 4(b).
FIG. 14(c) is a top view of a first lens of FIG. 5(c).
FIG. 14(d) is a top view of the first lens of FIG. 14(a).
FIG. 14(e) is a longitudinal cross sectional view of a lens module in which the first lens of FIG. 14(a) is combined with the light shielding holder.
FIG. 14(f) is a longitudinal cross sectional view of a lens module in which the exemplary variation of the lens module of FIG. 14(b) is combined with the light shielding holder.

Instead of the lens and the lens module of FIG. 14, lens support plate 61C or 62C including a through hole penetrating a position corresponding to the optical surface A side may be provided inside the transparent resin material to configure the lens and lens module of the electronic element module of FIG. 8. In this case, both the lens support plates 61C and 62C have a light shielding function. The outer circumference portion side of the through hole on the optical surface A side corresponds to the spacer section, and the outer circumference portion side of the through hole is configured to be thicker than the further outer circumference portion side to shield light from the transverse direction. A penetrating portion 68 and/or concave portion for releasing the resin material at the resin forming stage are provided at the further outer circumference portion of the lens support plates 61C and 62C. This is illustrated in FIGS. 15(a) and 15(b).

Figure 15:
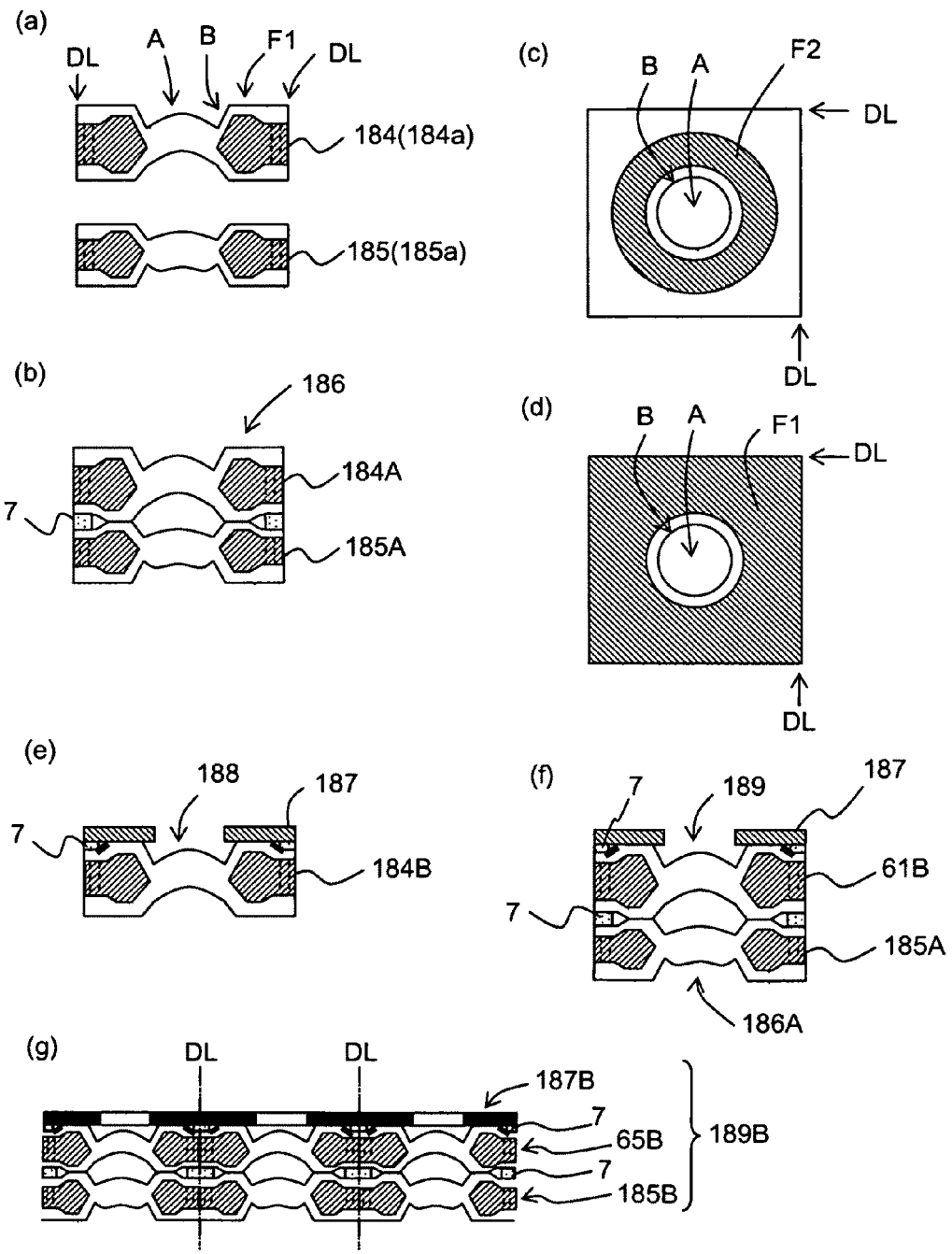
FIG. 15(a) is a longitudinal cross sectional view illustrating an exemplary variation of each lens of FIG. 8.
FIG. 15(b) is a longitudinal cross sectional view illustrating an exemplary variation of a lens module of FIG. 8.
FIG. 15(c) is a top view of a first lens of FIG. 8.
FIG. 15(d) is a top view of a first lens of FIG. 15(a).
FIG. 15(e) is a longitudinal cross sectional view of a lens module in which the first lens of FIG. 15(a) is combined with the light shielding holder.
FIG. 15(f) is a longitudinal cross sectional view of a lens module in which the exemplary variation of the lens module of FIG. 15(b) is combined with the light shielding holder.
FIG. 15(g) is a longitudinal cross sectional view illustrating an exemplary essential part structure of a lens wafer module in which a light shielding holder wafer, a first lens wafer and a second lens wafer are laminated.

FIG. 15(a) is a longitudinal cross sectional view illustrating an exemplary variation of each lens of FIG. 8. FIG. 15(b) is a longitudinal cross sectional view illustrating an exemplary variation of the lens module of FIG. 8. FIG. 15(c) is a top view of the first lens of FIG. 8. FIG. 15(d) is a top view of the first lens of FIG. 15(a). FIG. 15(e) is a longitudinal cross sectional view of a lens module in which the first lens of FIG. 15(a) is combined with the light shielding holder. FIG. 15(f)

is a longitudinal cross sectional view of a lens module in which the exemplary variation of the lens module of FIG. 15(*b*) is combined with the light shielding holder. FIG. 15(*g*) is a longitudinal cross sectional view illustrating an exemplary essential part structure of a lens wafer module in which a light shielding holder wafer 187B, a first lens wafer 65B and a second lens wafer 185B are laminated.

It is possible to obtain a large number of first lenses 184 as well as second lenses 185 as illustrated in FIG. 15(*a*) by cutting the first and second lens wafers 65B and 66B along the dicing lines DL. A spacer section with a predetermined thickness is provided at each of the outer circumference sides of the lens optical surface A at the center portion in the first and second lenses 184 and 185. As illustrated by the shaded portion of the outer quadrilateral and inner circle in the plan view in FIG. 15(*d*), the spacer section is a planarized section F1, which is protruded from the circular outer circumference portion B surrounding the optical surface A, the spacer section being higher than the convex shape of the optical surface A. In the first and second lenses 184 and 185, the optical surface A and the spacer section are simultaneously formed with a transparent resin material. In the first lens 61B of a quadrilateral in the plan view of FIG. 15(*f*), as illustrated by the annular shaded portion of FIG. 15(*c*), the spacer section is an annular protruded section F2, which is protruded from the circular outer circumference portion B surrounding the optical surface A, the protruded section F2 being protruded further than the convex shape of the optical surface A. Therefore, the difference between the first and second lenses 61B and 62B of FIG. 8 and the first and second lenses 184 and 185 of FIG. 15(*a*) is whether they have the annular protruded section F2 or planarized section F1 both on the front and back surfaces.

Further, a lens module 186 illustrated in FIG. 15(*b*) can be obtained by simultaneously cutting along the dicing lines DL in the state where the first lens wafer, in which a plurality of first lenses 184A are formed, and the second lens wafer, in which a plurality of second lenses 185A are formed, are adhered on top of another by the adhesive 7. Again, in the cutting stage, a cut-securing tape is adhered on the planarized section F1 of the lower second lens wafer, and a surface-protection tape for protecting the lens surface is adhered on the planarized section F1 of the upper first lens wafer, as similar to the cutting of the first lenses 184A and the second lenses 185A. As a result, during the cutting stage, the respective lens optical surfaces of the first and second lenses 184A and 185A are sealed and protected by the cut-securing tape and the surface-protecting tape, so that the lens optical surfaces do not become dirty from the cutting water. However, there is also a method for cleaning the optical surface A by spin cleaning without adhering the surface-protecting tape 9*b* but maintaining the cut-securing tape 9*a* on the lens after the cutting. Thus, the adhering of the cut-securing tape 9*a* is essential, but the adhering of the surface-protecting tape 9*b* is not essential. It is possible to clean the lens surface by spin cleaning without using the surface-protecting tape. Therefore, it is suitable for the spacer section to be higher than the lens surface (optical surface A) on either the front surface or back surface of the lens.

The difference between the lens module 186 illustrated in FIG. 15(*b*) and the lens module (first lens 61B and second lens 62B) of FIG. 8 is whether they have the annular protruded section F2 or planarized section F1 both on the front and back surfaces.

In this case, between the spacer section of the upper first lens 184A and the spacer section of the lower second lens 185A, the respective annular protruded sections F2 are in direct contact with each other, and the adhesive 7 is provided in the space portion surrounded by the bottom portion on the further outer circumference side of each planarized surface, so that the first lens 184A is adhered to the second lens 185A.

Further, the first lens 184A in FIG. 15(*a*) includes the optical surface A and the planarized section F1 on the front surface, the planarized section F1 being more protruded than the optical surface A. In this case, the first lens 184*a* and the second lens 185 are provided together as a set. Further, when the lens of the second lens 185*a* is protruded, the first lens 184 and the second lens 185*a* are provided as a set. Even if the optical surface A of the front surface of the second lens 185*a* is protruded, it fits in the concave portion of the back surface of the first lens 184. The optical surface A and the planarized section F1, which is more protruded than the optical surface A, are provided only on the back surface of the second lens 185*a*. Because of this, each lens optical surface A does not become dirty from the cutting water, as described above.

In summary, it is suitable as long as the optical surface A and the more protruded, protruded section F2 or planarized section F1 are provided at least on either of the front surface or the back surface.

Further, as illustrated in FIG. 15(*e*), a lens module 188 can be configured by laminating a light shielding holder 187 on the first lens 184 of FIG. 15(*a*) by the adhesive 7 in such a manner that the optical surface A aligns the opening of the light shielding holder 187. Further, as illustrated in FIG. 15(*f*), a lens module 189 can be configured by laminating the light shielding holder 187 by the adhesive 7 on a lens module 186A, which is configured of the first lens 61B of FIG. 8 and the second lens 185A of FIG. 15(*b*) in such a manner that the optical surface A aligns the opening of the light shielding holder 187. Thus, the lens and the light shielding holder 187 are provided as a set to configure a lens module.

The lens modules 188 and 189 can also be manufactured using another manufacturing method. As illustrated in FIG. 15(*g*), a lens wafer module 189B can be manufactured as an optical element wafer module by laminating the first lens wafer 65B as an optical element wafer, a second lens wafer 185B as an optical element wafer and a light shielding holder wafer 187B by the adhesive 7. In this case, the first lens wafer 65B and the light shielding holder wafer 187B may be laminated first by the adhesive 7 in such a manner that the optical surface A aligns an opening of the light shielding holder 187B, and subsequently, the second lens wafer 185B may be laminated therebelow in such a manner that the optical surfaces A align with one another. Further, the first lens wafer 65B and the second lens wafer 185B may first be laminated by the adhesive 7 in such a manner that the optical surfaces A align with one another, and subsequently, the light shielding holder wafer 187B may be adhered thereabove in such a manner that the optical surfaces A aligns with the opening of the light shielding holder wafer 187B. Further, the light shielding holder wafer 187B may be adhered by the adhesive 7 on a front surface side of a lens wafer module constituted of the first lens wafer 65B and the second lens wafer 185B in such a manner that the optical surfaces A aligns with the opening of the light shielding holder wafer 187B.

Next, as illustrated in FIG. 15(*g*), the lens wafer module 189B is simultaneously cut at the dicing lines DL between the lenses using a dicing blade or a dicing wire to be individualized for each lens. At this stage, the process is performed while a cut-protection tape and a cut-securing tape are adhered respectively on the front and back surfaces of the lens wafer module 189B. The lens module 189 can also be manufactured by the above described method. However, there is also a method for cleaning the optical surface A by spin cleaning without adhering the surface-protecting tape 9b but maintaining the cut-securing tape 9a on the lens after the cutting. Thus, the adhering of the cut-securing tape 9a is essential, but the adhering of the surface-protecting tape 9b is not essential. It is possible to clean the lens surface by spin cleaning without using the surface-protecting tape. Therefore, it is suitable for the spacer section to be higher than the lens surface (optical surface A) on either the front surface or back surface of the lens.

In Embodiment 3, for example, a combination of two lenses (lens module 186) of the first lens 184 and the second lens 185, or for example, a single lens of the first lens 184 or second lens 185 have been described; however, without the limitation to these, it is also possible to combine three or more lenses as an optical element to configure a lens module as an optical element module. Other optical elements may be used instead of the lens, the other optical elements including a prism and an optical function element (hologram optical element, for example). The prism and optical function element (hologram optical element, for example) can be formed in the optical surface A of the lens.

(Embodiment 4)

In Embodiment 4, a case will be described in detail where a light shielding plate is interposed between a first lens and a second lens to stabilize a lens space and improve light shielding characteristics.

Figure 16:
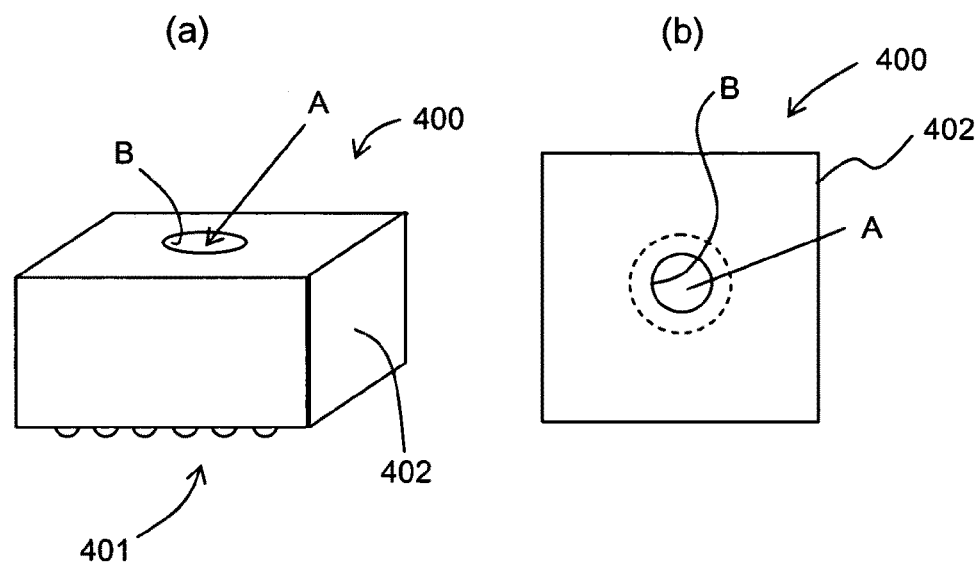
FIG. 16 is an exterior view of an electronic element module according to Embodiment 4.

FIG. 16 is an exterior view of an electronic element module 400 according to Embodiment 4. FIG. 16(a) is a perspective view thereof. FIG. 16(b) is a top view thereof.

As illustrated in FIGS. 16(a) and 16(b), the image capturing element module 400 (sensor module 10D) as an electronic element module of Embodiment 4 includes: an optical element or an optical element module (not shown) constituted of one or a plurality of lenses, in which an optical surface A is provided at a center portion; and an image capturing element chip 401. The optical element or an optical element module and the image capturing element chip 401 are housed in a light shielding holder 402, the light shielding holder 402 shielding an upper surface and a side surface, excluding the optical surface A, to shield the surface of the image capturing element. The image capturing element module 400 is simultaneously cut from an image capturing element wafer module, and therefore, it has a plan-view external shape of a quadrilateral as illustrated in FIG. 16(b).

Figure 17:
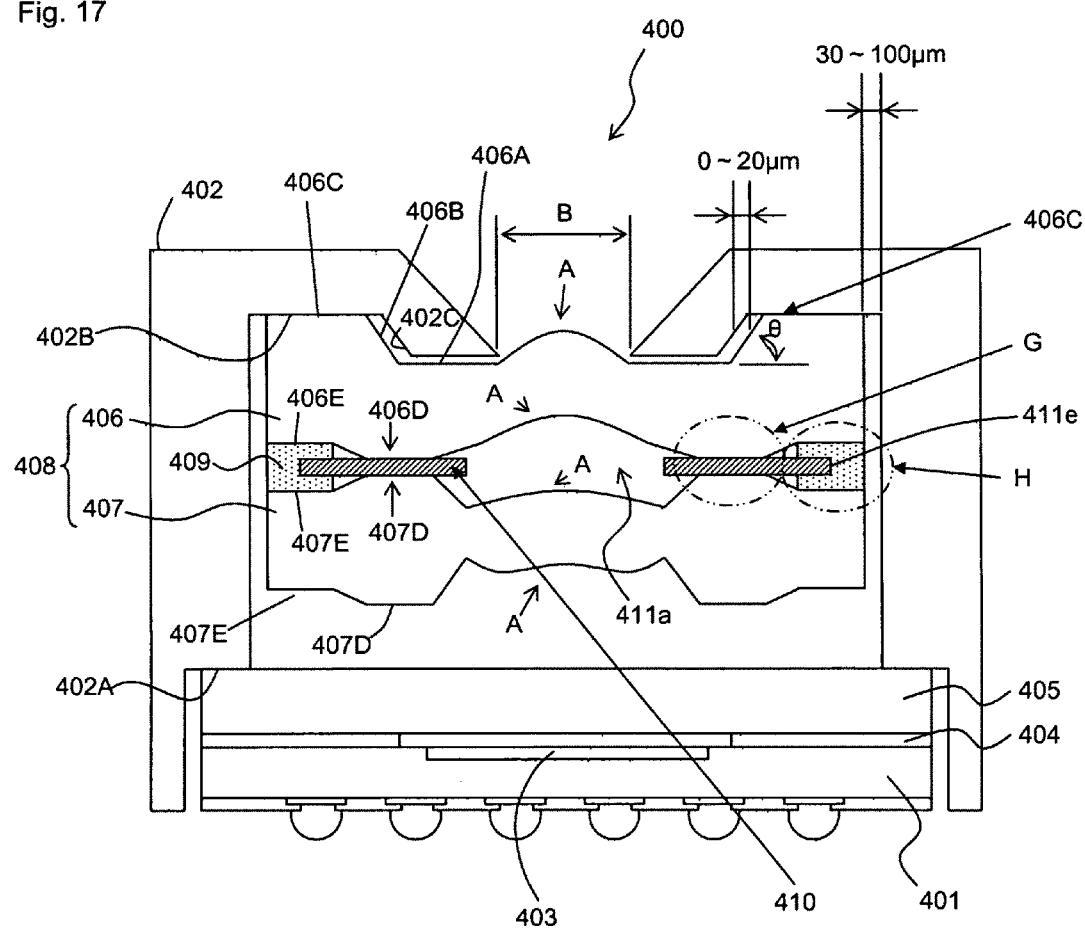
FIG. 17 is a longitudinal cross sectional view illustrating a detailed exemplary structure of an image capturing element module according to Embodiment 4.

FIG. 17 is a longitudinal cross sectional view illustrating a detailed exemplary structure of the image capturing element module 400 of Embodiment 4.

As illustrated in FIG. 17, the image capturing element module 400 according to Embodiment 4 includes: an image capturing element chip 401 as an electronic element, in which an image capturing element 403 including a plurality of light receiving sections for capturing an image of a subject is provided at the center portion; a resin adhesion layer 404 provided around the image capturing element 403 above the image capturing element chip 401; a transparent support substrate 405, such as a glass plate, covering the image capturing element 403 and adhered and fixed on the resin adhesion layer 404; a lens module 408 as an optical element module, which is constituted of a first lens 406 and second lens 407 provided in such a manner that each lens position (position of each optical surface A) coincides the image capturing element 403; and the light shielding holder 402 for shielding outside light except for image-capturing light, where the image capturing element chip 401, resin adhesion layer 404 and transparent support substrate 405 are provided below a step portion 402A and a lens module 408 is provided below a bottom surface portion 402B. FIG. 17 illustrates one unitary lens module 408 as a lens wafer module. In practice, although this will be described later in detail, the one unitary lens module 408 is manufactured such that a lens wafer module is cut to manufacture the large number of the individualized lens modules 408. The lens module 408 is housed in the light shielding holder 402 and an individual piece of an electronic element (image capturing element unit 80) is inserted therein to manufacture the image capturing element module 400 (sensor module 10D).

Figure 18:
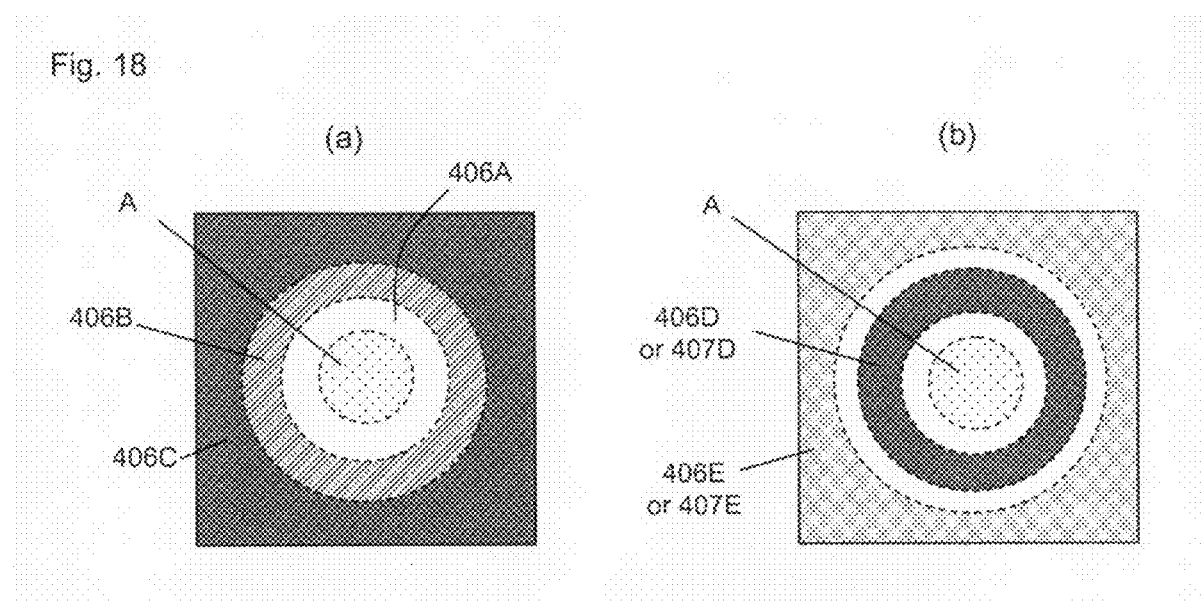
FIG. 18(a) is a plan view illustrating a front surface of a first lens of FIG. 17.
FIG. 18(b) is a plan view illustrating a back surface of the first lens as well as front and back surfaces of a second lens of FIG. 17.

As illustrated in FIG. 18(a), the front surface of the first lens 406 of the lens module 408 includes a planarized spacer section 406C (planarized section or protruded section), which is annularly protruded in such a manner to surround the optical surface A, with a planarized surface 406A and an inclined surface 406B interposed therebetween from an outer circumference end portion of the optical surface A at the center portion. As illustrated in FIG. 18(b), a back surface of the first lens 406 includes a bottom surface portion 406E for placing an adhesive, with a step portion (inclined surface) interposed therebetween on a further outer circumference side of an annularly-protruded, planarized spacer section 406D surrounding the optical surface A at the center portion.

As illustrated in FIG. 18(b), both a front surface and a back surface of the second lens 407 include a bottom surface portion 407E for placing an adhesive, with a step portion (inclined surface) interposed therebetween on a further outer circumference side of an annularly-protruded, planarized spacer section 407D surrounding the optical surface A at the center portion.

An adhesive 409 is placed in a space portion surrounded by the bottom surface portions 406E and 407E, which are on a further outer circumference side of respective planarized surfaces of the spacer section 406D on the lower side of the upper first lens 406 and the spacer section 407D on the upper side of the lower second lens 407. As a result, the first lens 406 and the second lens 407 are adhered to each other. In this case, a UV curing resin is used for the adhesive 409.

The annular inclined surface 406B of the first lens 406 and the annular inclined surface 402C inside the aperture opening of the light shielding holder 402 are guided, so that upper spacer section 406C and the inclined surface 406B of the first lens 406 engage with the inclined surface 402C of the light shielding holder 402. A gap of 30 µm to 100 µm is formed between an inner circumference surface of the light shielding holder 402 and an outside surface of the lens module 408 so that it becomes easy to house the lens module 408 in the light shielding holder 402 when assembling. Further, a gap of 0 µm to 20 µm is formed between the inclined surface 406B of the first lens 406 and the inclined surface 402C inside the light shielding holder 402. The engaging angle θ of the inclined surface 406B is approximately 30 to 80 degrees. Still preferably, the engaging angle θ is approximately 45 to 60 degrees. As a result, the positional accuracy is increased to within plus or minus 10 µm between the optical surface A of the first lens 406 and an aperture opening B of the light shielding holder 402.

A light shielding plate 410 is interposed between the spacer section 406D on the lower side of the upper first lens 406 and the spacer section 407D on the upper side of the lower second lens 407. In the light shielding plate 410, a through hole is formed in the center portion corresponding to the optical surface.

In addition, stainless steel (SUS) dyed black, black PET or a PI substrate with a black metal sputtered surface or black vapor deposited surface can be used for the light shielding plate 410. A light shielding plate of stainless steel dyed black can be formed with a thickness of 100 µm or less, and therefore, there will be less variation in the size in the thickness direction. For example, when a stainless-steel light shielding plate with 20 μm in thickness is used, the variation in the thickness will be approximately plus or minus 2 μm, which is within a range that is optically applicable. Therefore, the light shielding plate 410 can be directly put between the spacer section 406D and the spacer section 407D, and the thickness of the light shielding plate 410 is still thin, resulting in little variation in the lens space as well as little optical influence.

As illustrated by a direct contact portion G within a circle of FIG. 17, the lens space between the first lens 406 and the second lens 407 and the thickness of the lens module 408 are defined by the direct contact of the respective planarized surfaces of the annular protruded portions of the spacer sections 406D and 407D. That is, the lens space is determined by the contacting surfaces (spacer sections 406D and 407D) of the first lens 406 and the second lens 407 as well as the thickness of the light shielding plate 410. The adhesive 409 is positioned in the space portion (gap portion) surrounded by the bottom surface portions 406E and 407E further outside of the contacting surfaces, so that the first lens 406 and the second lens 407 are adhered by the adhesive 409. As a result, even if there is too much adhesive 409, the adhesive 409 is only spread within the gap and there is no negative influence created by the variation due to the thickness or amount of the adhesive 409. Thus, the lens space is stabilized and the optical characteristics of the lens module 408 are also stabilized. Again, in this case, it is possible to provide a vent 409A, which will be described later, in the adhesive 409 positioned in the periphery of the optical surface A so as to prevent the adhesive 409 from peeling off when reflowing.

As illustrated by an adhering portion H within a circle of FIG. 17, an outer circumference portion of the light shielding plate 410 of a disc shape (or circular shape) in a plan view includes a groove portion 411e, where the outer circumference portion is partially grooved, and does not reach outer circumference ends of the first and second lenses 406 and 407, and a gap is provided. The groove portion 411e is provided so that UV light to the adhesive 409 will not be shielded by the light shielding plate 410 and it becomes possible to use a UV light curing resin for the adhesive 409, and the area where the light shielding plate 410 is cut is reduced. When a thermosetting resin is used for the adhesive 409, there is a possibility of producing a deformity in the lenses due to the difference in the amount of the extension of the upper and lower lenses during heat processing. When a UV light curing resin is used for the adhesive 409, the adhesive 409 can be cured by UV light at a low temperature, resulting in a stabilization of the overall size of the lens module 408.

When a stainless steel plate material (SUS) is used for the light shielding plate 410 and cutting is performed using a dicing blade or a wire, the blade of the dicing blade may become blocked or the cutting surface may become rough. Therefore, it is desirable to reduce the cutting area. Cut guiding holes are provided so as to reduce the area to be cut in the light shielding plate 410. For example, for the facilitation of simultaneous cutting, FIG. 22(*a*) illustrates a case where the cut guiding holes are long holes, and FIG. 22(*b*) illustrates a case where the cut guiding holes are cross shaped and L-letter shaped.

Herein, a first lens wafer, a light shielding plate wafer and a second lens wafer will be described, and further, a dicing line DL will be described with reference to the light shielding plate wafer.

Figure 21:
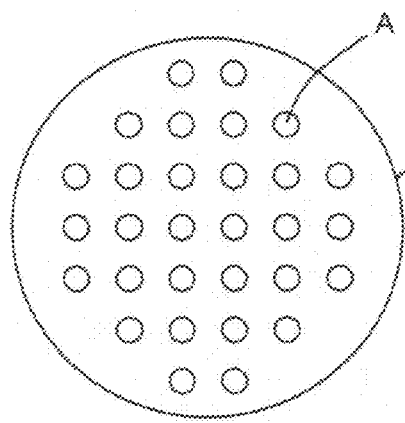
FIG. 21 is a plan view illustrating one example of a first lens wafer.

FIG. 21 is a plan view illustrating one example of a first lens wafer 416. In the first lens wafer 416 of FIG. 21, the plurality of optical surfaces A are uniformly arranged in the longitudinal and transverse directions. In practice, a larger number of the optical surfaces A are arranged in a matrix.

Figure 22:
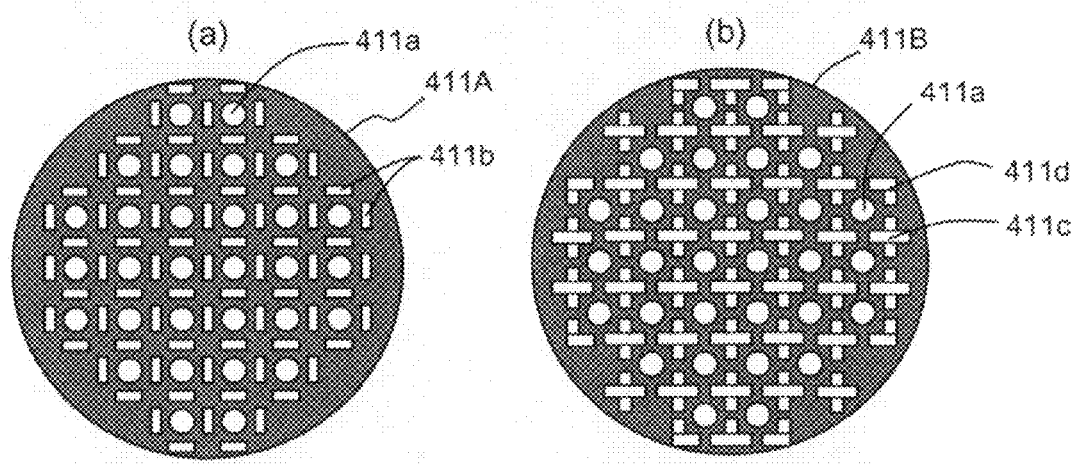
FIG. 22 is a plan view illustrating one example of a light shielding plate wafer.
Figure 24:
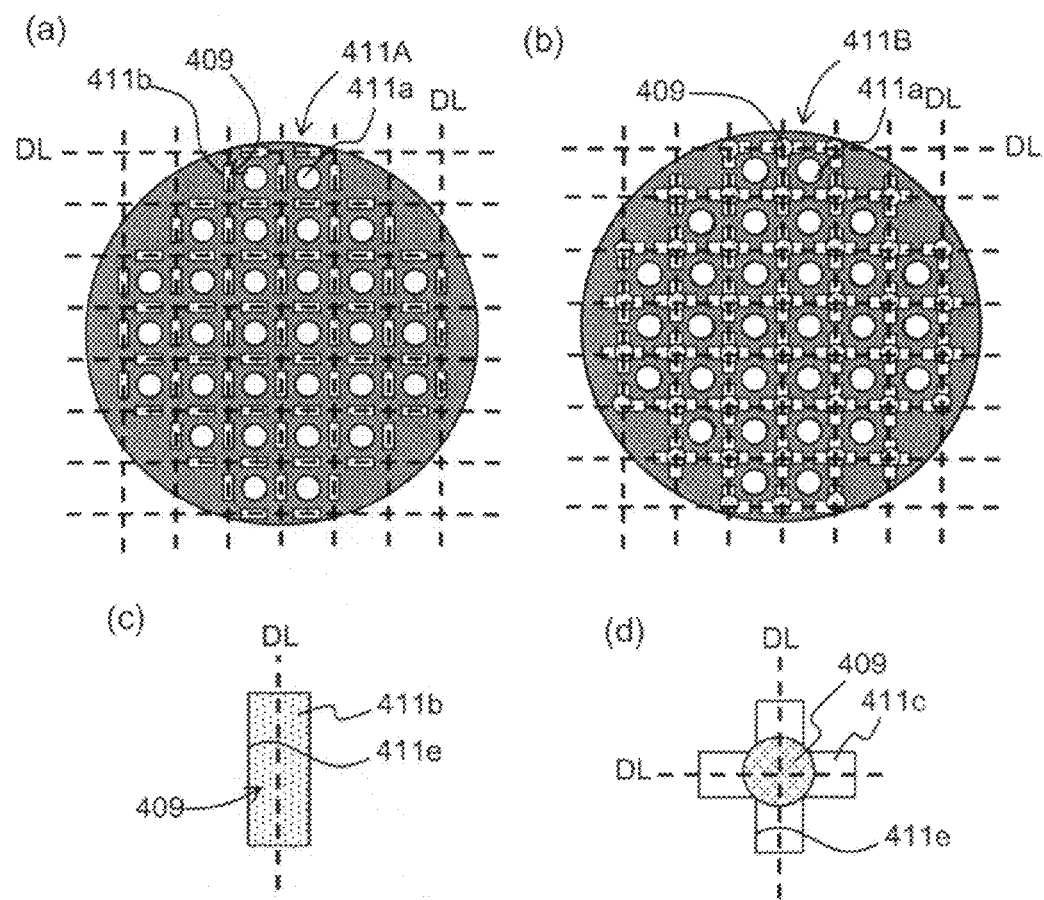
FIGS. 24(a) and 24(b) are each a plan view illustrating a positional relationship between cut guiding holes and dicing lines, both of which facilitate simultaneous cutting, in the light shielding plate wafer of FIG. 22.
FIG. 24(c) is an enlarged view of long holes of FIG. 24(a).
FIG. 24(d) is an enlarged view of cross-shaped holes of FIG. 24(b).

FIG. 22 is a plan view illustrating one example of a light shielding plate wafer 411. FIG. 22(*a*) is a view illustrating a case where cut guiding holes are long holes. FIG. 22(*b*) is a view illustrating a case where the cut guiding holes are cross-shaped and L-letter shaped. In FIGS. 22(*a*) and 22(*b*), the plurality of lens openings 411a are arranged uniformly in the longitudinal and transverse directions. In practice, a lager number of the lens openings 411a are arranged in a matrix. The same number of the lens openings 411a are formed as the number of the optical surfaces A, corresponding to the positions of the optical surfaces A in FIG. 21. Long holes 411b in FIG. 22(*a*) as well as cross-shaped holes 411c and L-letter shaped holes 411d in FIG. 22(*b*) are formed as cut guiding holes for facilitating simultaneous cutting in the periphery of the lens opening 411a and between adjacent lens openings 411a. FIG. 24(*a*) and FIG. 24(*b*) respectively correspond to FIG. 22(*a*) and FIG. 22(*b*). FIG. 24(*a*) and FIG. 24(*b*) illustrate a positional relationship between the cut guiding hole and the dicing line DL for the facilitation of simultaneous cutting.

Figure 23:
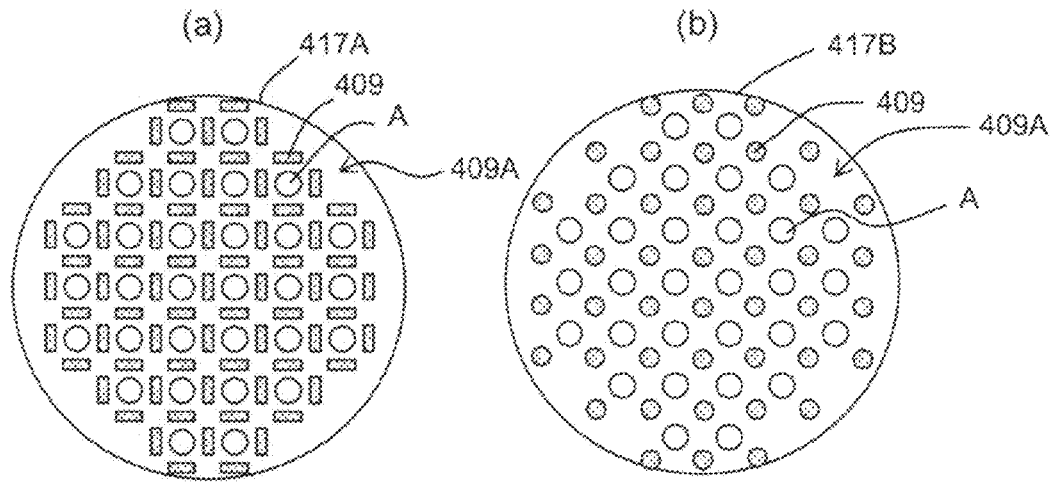
FIG. 23 is a plan view illustrating one example of a second lens wafer.

FIG. 23 is a plan view illustrating one example of a second lens wafer 417. FIG. 23(*a*) is a view illustrating a state where the adhesive 409 is applied when the cut guiding holes of the light shielding wafer 411A are long holes. FIG. 23(*b*) is a view illustrating a state where the adhesive 409 is applied in a circular shape when the cut guiding holes of the light shielding wafer 411A are cross-shaped and T-letter shaped and L-letter shaped holes.

Next, a case will be described with reference to FIGS. 19(*a*) to 19(*c*), where the first lens wafer 416, light shielding plate wafer 411 and second lens wafer 417 are modularized to manufacture a later-described lens wafer module 418. FIG. 24(*c*) is an enlarged view of a long hole 411b of FIG. 24(*a*). FIG. 24(*d*) is an enlarged view of a cross-shaped hole 411c of FIG. 24(*b*).

In FIG. 24(*a*) and FIG. 24(*c*), when a light shielding wafer 411A overlaps a second lens wafer 417A, positions of a long hole 411b of a rectangular shape and an adhesive 409 correspond to each other. The long hole 411b of the cut guiding hole is cut long the dicing line DL, which is along the center line in the width direction, forming the groove portion 411e.

In FIG. 24(*b*) and FIG. 24(*d*), when a light shielding wafer 411B overlaps a second lens wafer 417B, positions of a center portion of the cross-shaped hole 411c and a circular-shaped adhesive 409 correspond to each other, for example. The cross-shaped hole 411c of the cut guiding hole is cut long the dicing line DL, which is along the center line in the width direction, forming the groove portion 411e of an L-letter shape along a corner portion.

Therefore, in the individualized light shielding plate 410, a lens opening 411a is provided at a position corresponding to each optical surface A of the first lens 406 and the second lens 407, and further, the groove portion 411e is included where a part of the outer circumference edge thereof is grooved. The groove portion 411e is provided at four sides except for the corner portions of a quadrilateral in the plan view, or is formed at four corner portions. The groove portions 411e at the four corner portions are either of a ¼ circular shape, which is a remaining portion after cutting a circular hole crosswise, or an L-letter shape along a corner portion, which is a remaining portion after cutting a cross-shaped hole, T-letter shaped hole or L-letter shaped hole.

Figure 19:
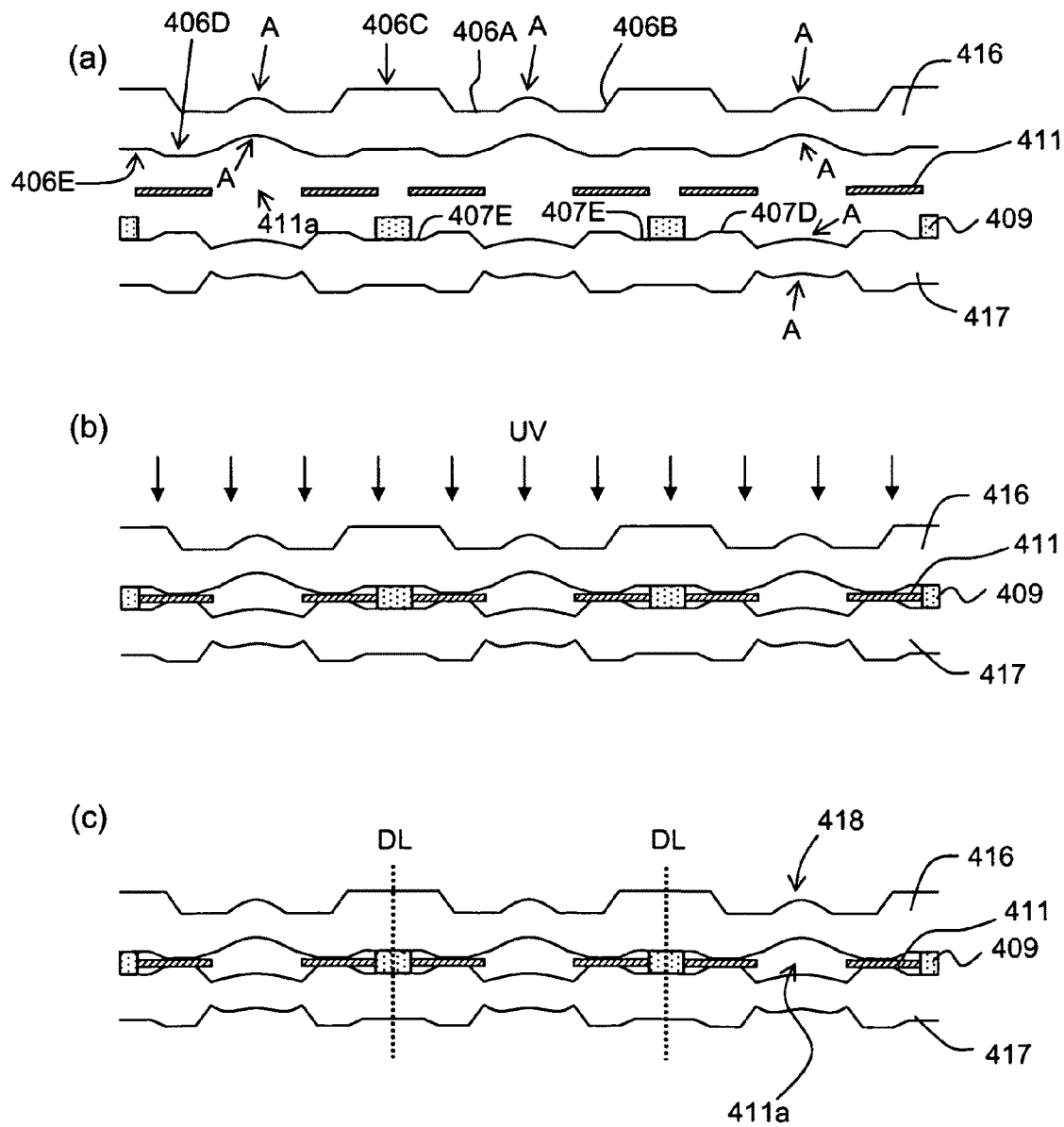
FIGS. 19(a) to 19(c) are each an essential part longitudinal cross sectional view illustrating each manufacturing step when a first lens wafer and a second lens wafer are modularized to manufacture a lens wafer module.

FIGS. 19(*a*) to 19(*c*) are each an essential part longitudinal cross sectional view illustrating each manufacturing step of the case where the first lens wafer 416 and second lens wafer 417 are modularized to manufacture the lens wafer module 418.

First, in an adhesive applying step of FIG. 19(*a*), the adhesive 409 is applied from a nozzle of a dispensing device on the bottom surface portion 407E along the gridlike-fashion dicing lines DL (see FIG. 24) of the second lens wafer 417, in which the plurality of second lenses 407 each including an optical surface A are arranged in a matrix, as illustrated in FIGS. 23(*a*) and 23(*b*). Simultaneously, it is also possible to position the adhesive 409 in a rectangular shape at the four peripheral sides except for four corners (vent 409A) in the periphery of the optical surface A, as illustrated in FIG. 23(*a*). In this case, the four peripheral corners of the optical surface A become the vents 409A.

Further, as illustrated in FIG. 23(*b*), it is also possible to position the adhesive 409 in a quadrilateral or circular shape only at four corners in the periphery of the optical surface A. In this case, the four sides in the periphery of the optical surface A become the vents 409A.

Herein, the adhesive 409 is applied on the bottom surface portion 407E between the second lenses 407 on the front surface of the second lens wafer 417; however, without the limitation to this, the adhesive 409 may be applied on the bottom surface portion 406E between the first lenses 406 on the back surface of the first lens wafer 416. Alternatively, the adhesive 409 may be applied on a predetermined position of the light shielding wafer 411. The predetermined position of the light shielding wafer 411 is a position of the cut guiding hole corresponding to the bottom surface portion 406E and the bottom surface portion 407E.

Next, in a laminating step of FIG. 19(*b*), respective optical axes of the optical surfaces A of the first lenses 406 in the first lens wafer 416 are aligned with respective optical axes of the optical surfaces A of the second lenses 407 in the second lens wafer 417, and respective centers of the lens openings 411*a* of the light shielding plate wafer 411 are aligned with respective optical axes of the optical surfaces A, and subsequently, the upper first lens wafer 416 and the lower second lens wafer 417, both of which are formed at a wafer scale, are adhered by the adhesive 409 with the light shielding plate wafer 411 put in between, for modularization. Subsequently, ultra violet rays (UV) are irradiated from the top of the wafer to cure the adhesive 409. In this case, although the light shielding plate wafer 411 is adhered by the adhesive 409, the light shielding plate wafer 411 is not necessarily adhered and may be separated from the adhesive 409, as described later.

As described above, it is preferable to use a UV curing resin as the material of the adhesive 409. This is because there is a possibility for the positions of the upper first lens 406 and the lower second lens 407 to be shifted due to the difference in the amount of extension of the first lens 406 and the second lens 407 when heated if a thermosetting resin is used for the adhesive 409. In addition, it is also effective to use a resin that cures by either UV light or heat as the adhesive 409. In this case, the resin portion covered by the light shielding plate wafer 411 can be cured by heat. Therefore, it is less likely to cause a positional shifting of the upper first lens 406 and the lower second lens 407 by first fixing the position of the upper first lens 406 and the lower second lens 407 by UV resin curing and subsequently performing heat processing.

Subsequently, as illustrated in a cutting step of FIG. 19(*c*), a cut-securing tape (not shown) is adhered on the front surface side of the plurality of first lenses 406 of the first lens wafer 416 of a wafer scale or on the back surface side of the plurality of second lenses 407 of the second lens wafer 417. A cut-protection tape (not shown) may be adhered on the opposite side from the surface on which the cut-securing tape is adhered. Further, the lens wafer module 418 is cut simultaneously along the dicing lines DL indicated by dotted lines to be individualized into the lens modules 408.

Subsequently, a wafer-shaped transparent support substrate, such as a glass plate, is adhered and fixed by the resin adhesion layer 404 to cover the image capturing element wafer 401, and an image capturing element wafer unit is manufactured. The image capturing element wafer unit is cut simultaneously along the dicing lines DL to be individualized as image capturing element chip modules 412 of FIG. 20.

Figure 20:
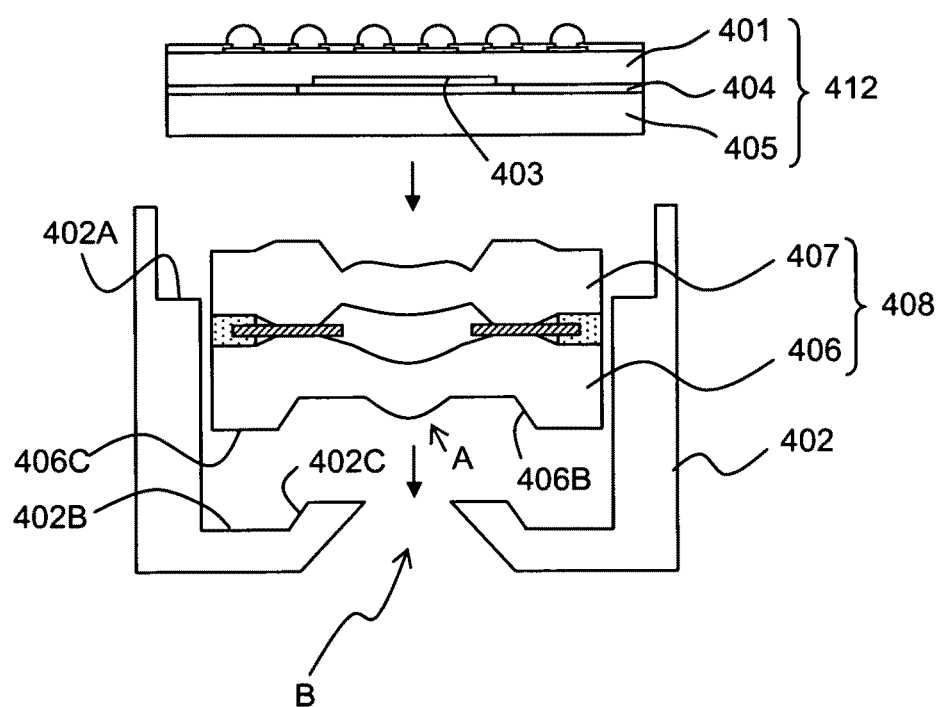
FIG. 20 is a cross sectional view of each member, illustrating a step of assembling an image capturing element module, where a light shielding holder houses a lens module and an image capturing element chip module.

Further, as illustrated in an image capturing element module assembling step of FIG. 20, the light shielding holder 402 is placed upside down so that the open portion is positioned to the top. The lens module 408 is inserted from the side of the first lens 406 and the inclined surface 406B of the first lens 406 is engaged with the inclined surface 402C of the light shielding holder 402. Subsequently, because of the empty weight of the lens module 408, both the annular inclined surface 406B of the first lens 406 and the annular inclined surface 402C inside the aperture opening B of the light shielding holder 402 are guided so that the spacer section 406C on the upper side of the first lens 406 is accurately engaged with the bottom surface portion 402B of the light shielding holder 402. Further, the lens module 408 is fixed in the light shielding holder 402 by an adhesive or the like. Subsequently, the transparent support substrate 405 side of the image capturing element chip module 412 is positioned on the step portion 402A of the light shielding holder 402 and is fixed by an adhesive or the like. As a result, the image capturing element module 400 is manufactured.

As described above, the lens module 408 is inserted to the middle of the light shielding holder 402, which functions as a light shielding cover. Subsequently, the lens module 408 is dropped and accurately positioned along the inclined surface at the engaging portion (inclined surfaces 402C and 406B), and the image capturing element chip module 412 is mounted in the light shielding holder 402.

Although apart conveying device with a positioning accuracy of approximately 10 µm is very expensive, a part conveying device with a positioning accuracy of approximately 30 µm is comparatively inexpensive. Therefore, for the positioning with a gap of up to approximately 30 µm, the lens module 408 is brought to the light shielding holder 402 to be inserted, and subsequently the lens module 408 is dropped to be positioned with high accuracy along the engaging portion (inclined surfaces 402C and 406B) of the light shielding holder 402.

Figure 25:
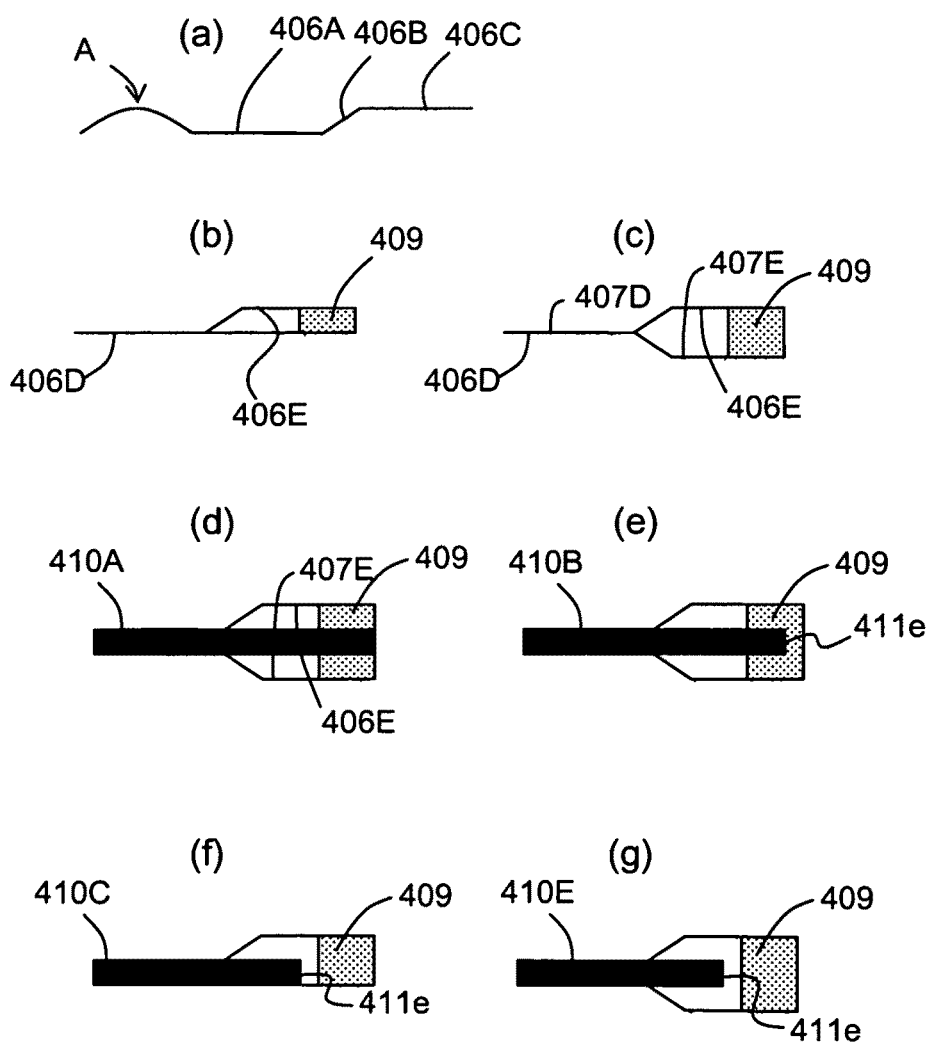
FIG. 25 is a view illustrating a case where a spacer section of a first lens and a spacer section of a second lens are not in direct contact with each other and a case where a light shielding plate wafer is not directly interposed therebetween.

FIG. 25 is a view for illustrating a case where the light shielding wafer 411A of FIG. 22(*a*) is used and a case where it is not used. FIG. 25(*a*) is an essential part cross sectional view of a front surface shape of the first lens 406. FIG. 25(*b*) is an essential part cross sectional view of a back surface shape when the first lens 406 is adhered on a planarized portion that does not have a bottom portion using the adhesive 409. FIG. 25(*c*) is an essential part cross sectional view of a joint surface of the first lens 406 and the second lens 407. FIGS. 25(*d*), 25(*e*) and 25(*g*) are each an essential part cross sectional view of a joint surface when the light shielding plate 410 is put directly in between the first lens 406 and the second lens 407. FIG. 25(*f*) is an essential part cross sectional view of a joint surface when the light shielding plate 410 is put directly in between a planarized portion that does not have a bottom portion and the first lens 406.

FIGS. 25(*b*) and 25(*c*) illustrate a case where the light shielding plate 410 is not used. In FIG. 25(*b*), the planarized portion that does not have a bottom portion and the spacer section 406D of the first lens 406 are in direct contact with each other so that the lens space is stabilized. The adhesive 409 is positioned in the space portion of the bottom surface portion 406E on the outer circumference side of the spacer section 406D. In this case, the combination of the planarized portion that does not have a bottom portion and the first lens 406 includes, for example, the combination of the second lens that does not have a bottom portion and the first lens 406 that has a bottom portion, and a transparent support body, such as a glass plate, and the first lens 406 that has a bottom portion.

In FIG. 25(c), the spacer section 406D of the first lens 406 and the spacer section 407D of the second lens 407 are in direct contact with each other so that the lens space is stabilized. Further, the adhesive 409 is positioned in the space portion of the bottom surface portions 406E and 407E on the outer circumference side of the spacer sections 406D and 407D.

Further, FIGS. 25(d) to 25(g) illustrate a case where the light shielding plate 410 is used. FIG. 25(d) illustrates a case where a light shielding plate 410A corresponding to a cutting position is used. FIG. 25(e) illustrates a case where a light shielding plate 410B is used, which is shorter than the light shielding plate 410A and is positioned inside the adhesive 409 (a case where a cut guiding hole is included). FIGS. 25(f) and 25(g) illustrate a case where the light shielding plates 410C and 410E are used, which are separated from the adhesive 409.

Advantages and disadvantages of FIGS. 25(d) to 25(g) will be described hereinafter.

In FIG. 25(d), the outer circumference end portion of the light shielding plate 410A exists up to the very end of the cut outer circumference, thereby providing excellent light shielding characteristics. With regard to the cutting, it is not desirable for the light shielding plate 410A to have more cutting area. Further, different materials, that is the lens and the light shielding plate 410A, are adhered by the adhesive 409, and therefore, there is a possibility of the adhesive 409 to be peeled off at the interface of the light shielding plate 410A or the lens bottom portion during heat processing in a reflow.

In FIG. 25(e), the light shielding characteristics may slightly decrease since the gap (groove portion 411e) is provided in the light shielding plate 410B, compared to the case of FIG. 25(d). On the other hand, the cutting characteristics are improved since there is less cutting area. There is a portion where the adhesion is made only by the lens and the adhesive 409 through the gap (groove portion 411e), so that the adhesive 409 becomes difficult to peeled off.

In FIGS. 25(f) and 25(g), the light shielding characteristics may further decrease since the gap (groove portion 411e) is largely provided, compared to the case of FIG. 25(e). However, the same level of the cutting characteristics are maintained, and the peeling characteristics are further improved since the portion where the adhesion is made only by the lens and the adhesive 409 is increased.

A case will be described with reference to FIGS. 26(a) to 26(d), where a resin is prevented from being peeled off through the use of a vent 409A during reflowing when the spacer section 406D of the first lens 406 and the spacer section 407D of the second lens 407 are not indirect contact with each other.

Figure 26:
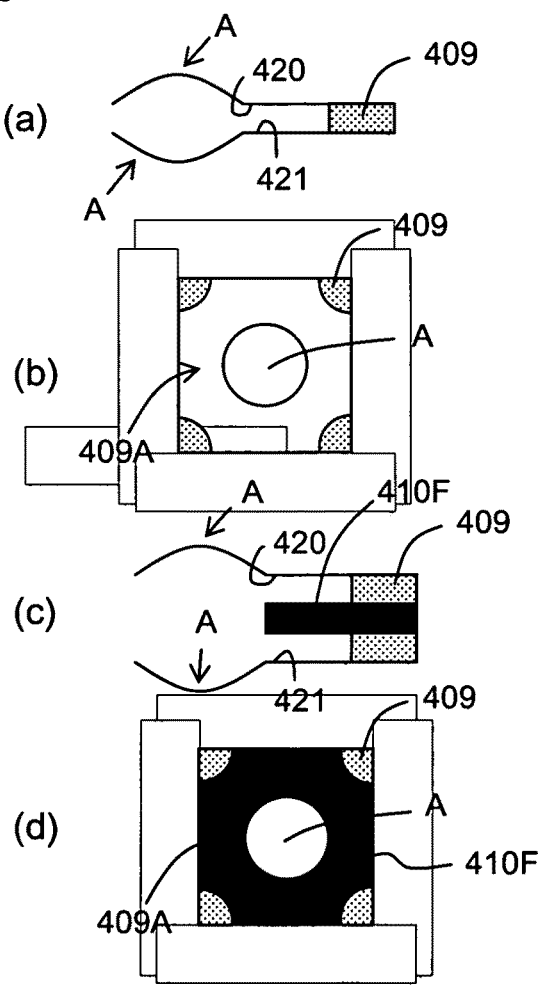
FIG. 26 is an illustration illustrating a case where a light shielding plate cut from the light shielding plate wafer of FIG. 22 is used and a case where the light shielding plate is not used.

FIG. 26 is an illustration for describing a case where the spacer section of the first lens and the spacer section of the second lens are not in direct contact with each other. FIG. 26(a) is an essential part cross sectional view of a lens joint surface when a light shielding plate 410F is not used. FIG. 26(b) is a plan view thereof. FIG. 26(c) is an essential part cross sectional view of a lens joint surface when the light shielding plate 410F is used. FIG. 26(d) is a plan view thereof.

As illustrated in FIGS. 26(a) to 26(d), the adhesive 409 is positioned in a space portion surrounded by a planarized portion on a further outer circumference side of a planarized surface of a spacer section 420 of an upper optical element and a planarized portion connected on a further outer circumference side of a planarized surface of a spacer section 421 of a lower optical element.

In this case, the respective planarized surfaces of the spacer section 420 of the upper optical element and the spacer section 421 of the lower optical element are not in direct contact with each other.

Further, as illustrated in FIGS. 26(c) and 26(d), the light shielding plate 410F is interposed between the respective planarized surfaces of the spacer section 420 of the upper optical element and the spacer section 421 of the lower optical element, among the plurality of optical elements. However, the light shielding plate 410F is not in contact with either the spacer section 420 or 421, but the light shielding plate 410F is connected to the spacer sections 420 and 421 with the adhesive 409 interposed therebetween. In this case, the adhesive 409 is positioned at a position of a cut guiding hole to adhere the light shielding plate 410F and the upper and lower lenses; however, without the limitation to this, the adhesive 409 may be positioned between a light shielding plate and an upper lens, and a light shielding plate and a lower lens.

(Embodiment 5)

Figure 27:
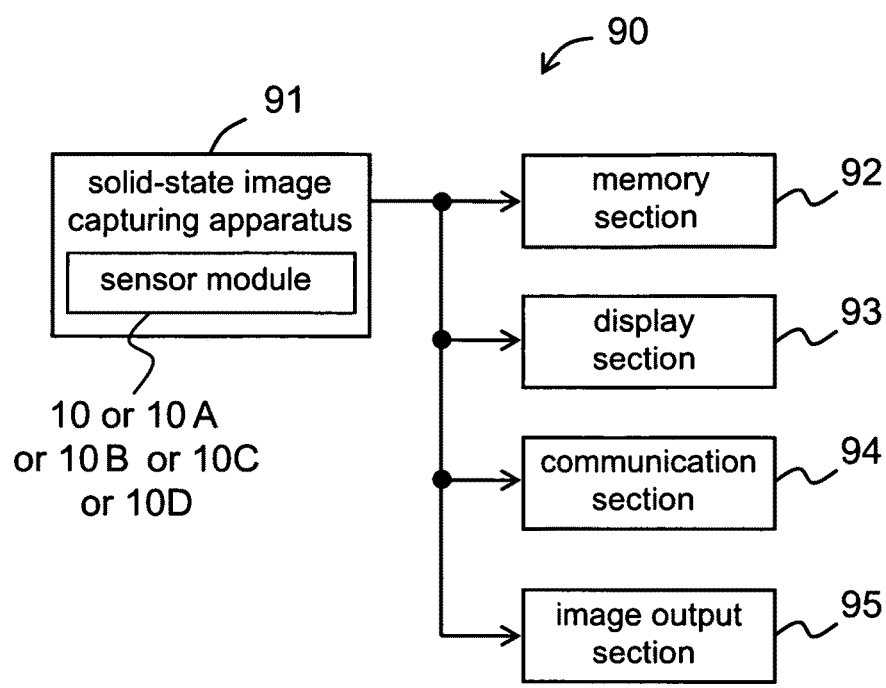
FIG. 27 is a block diagram schematically illustrating an exemplary configuration of an electronic information device of Embodiment 5 of the present invention, including a solid-state image capturing apparatus including a sensor module according to Embodiment 1, 2 or 4 of the present invention, used in an image capturing section thereof.
Figure 28:
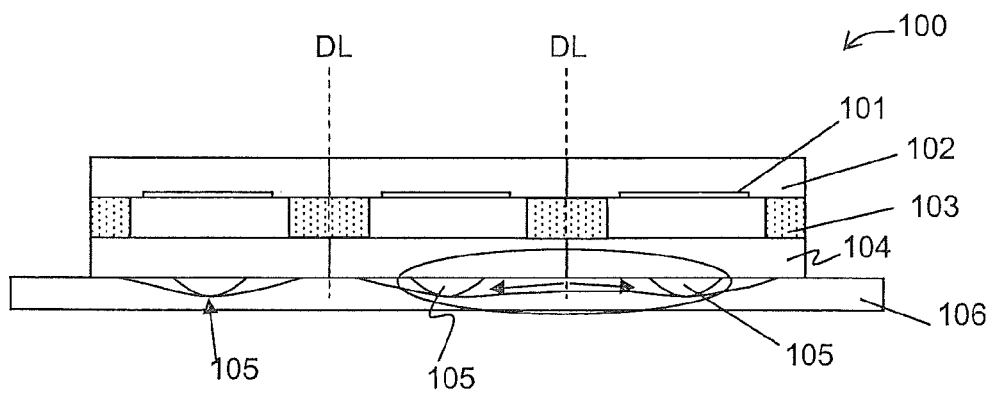
FIG. 28 is an essential part longitudinal cross sectional view illustrating one exemplary structure of a conventional image capturing element wafer module at a time of simultaneous cutting.
Figure 29:
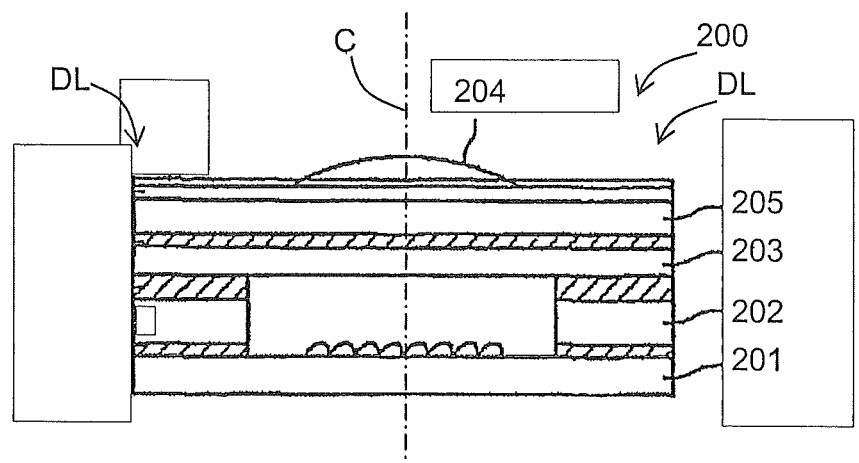
FIG. 29 is an essential part longitudinal cross sectional view illustrating an exemplary structure of a conventional image capturing element wafer module disclosed in Reference 1 at a time of simultaneous cutting.
Figure 30:
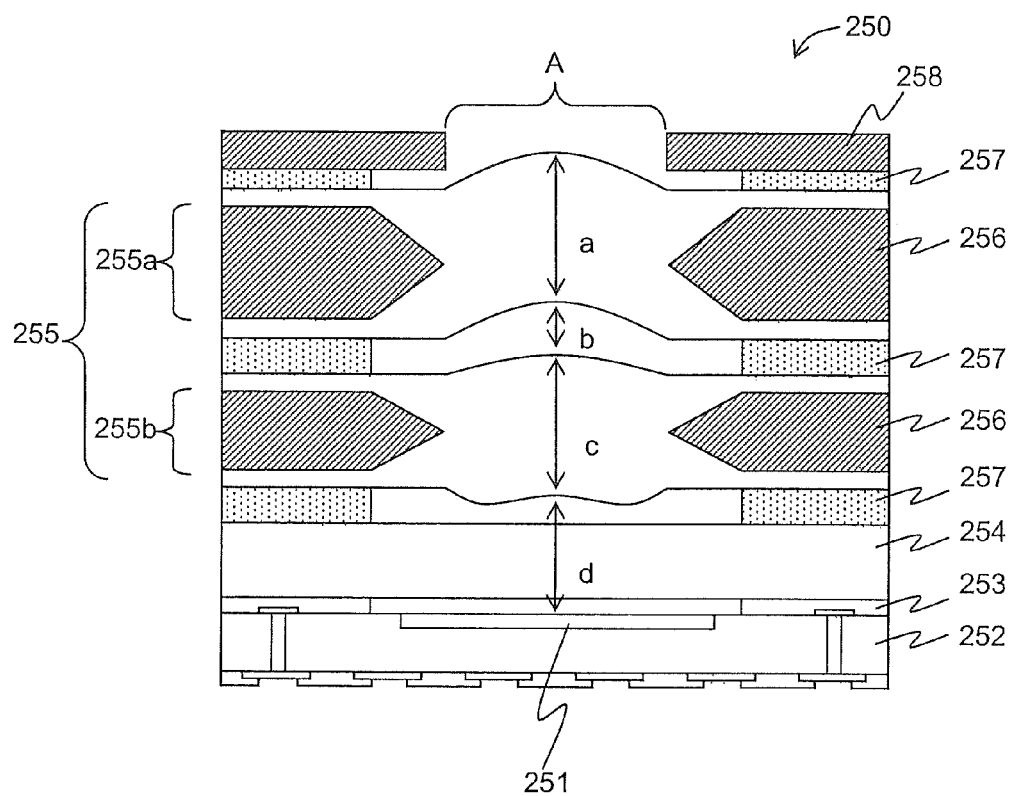
FIG. 30 is an essential part longitudinal cross sectional view illustrating an image capturing element wafer module in which a plurality of lens wafers disclosed in Reference 2 are used with lenses provided in a plurality of through holes of a lens substrate and the lens wafers are modularized with an image capturing element wafer.
Figure 31:
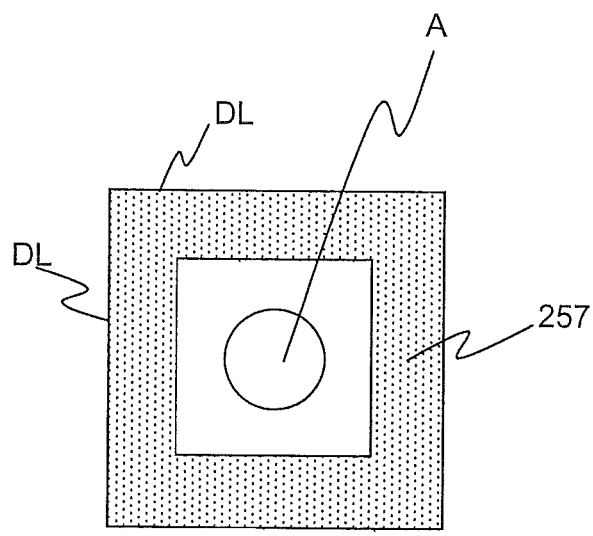
FIG. 31 is an arrangement plan of an adhesive, viewing the image capturing element wafer module of FIG. 30 from the top.
Figure 32:
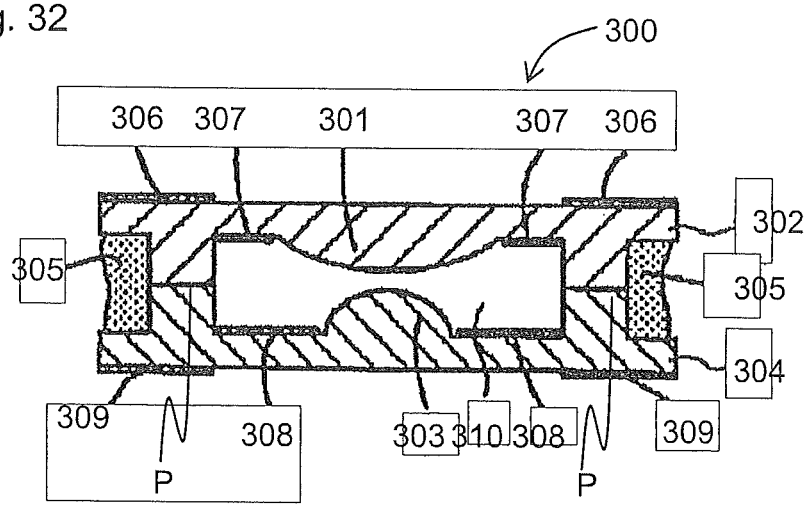
FIG. 32 is an essential part longitudinal view illustrating an exemplary structure of a conventional image capturing element wafer module as disclosed in Reference 3 at a time of simultaneous cutting.

FIG. 27 is a block diagram schematically illustrating an exemplary configuration of an electronic information device of Embodiment 5 of the present invention, including a solid-state image capturing apparatus including the sensor module 10, 10A, 10B or 10D according to Embodiment 1, 2 or 4 of the present invention, or the sensor module 10C including the lens and lens module according to Embodiment 3 of the present invention, used in an image capturing section thereof.

In FIG. 27, an electronic information device 90 according to Embodiment 5 of the present invention includes: a solid-state image capturing apparatus 91 for performing various signal processing on an image capturing signal from the sensor module 10, 10A, 10B or 10D according to Embodiment 1, 2 or 4, or the sensor module 10C including the lens and lens module according to Embodiment 3 of the present invention, so as to obtain a color image signal; a memory section 92 (e.g., recording media) for data-recording a color image signal from the solid-state image capturing apparatus 91 after a predetermined signal processing is performed on the color image signal for recording; a display section 93 (e.g., a liquid crystal display apparatus) for displaying the color image signal from the solid-state image capturing apparatus 91 on a display screen (e.g., liquid crystal display screen) after predetermined signal processing is performed on the color image signal for display; a communication section 94 (e.g., a transmitting and receiving device) for communicating the color image signal from the solid-state image capturing apparatus 91 after predetermined signal processing is performed on the color image signal for communication; and an image output section 95 (e.g., a printer) for printing the color image signal from the solid-state image capturing apparatus 91 after predetermined signal processing is performed for printing. Without any limitations to this, the electronic information device 90 may include any of the memory section 92, the display section 93, the communication section 94, and the image output section 95 such as a printer, other than the solid-state image capturing apparatus 91.

As the electronic information device 90, an electronic information device that includes an image input device is conceivable, such as a digital camera (e.g., digital video camera or digital still camera), an image input camera (e.g., a monitoring camera, a door phone camera, a camera equipped in a vehicle, or a television camera), a scanner, a facsimile machine, a camera-equipped cell phone device, or a personal digital assistance (PDA).

Therefore, according to Embodiment 5 of the present invention, the color image signal from the solid-state image capturing apparatus 91 can be: displayed on a display screen properly by the display section 93, printed out on a sheet of paper using an image output section 95, communicated properly as communication data via a wire or a radio by the communication section 94, stored properly at the memory section 92 by performing predetermined data compression processing; and various data processes can be properly performed.

Without the limitation to the electronic information device 90 according to Embodiment 5 described above, an electronic information device, such as a pick up apparatus including the electronic element module according to the present invention used in an information recording and reproducing section thereof, is also conceived. An optical element of the pick up apparatus in this case is an optical function element (hologram optical element, for example) that directs output light straight to be output and refracting and guiding incident light in a predetermined direction. In addition, as the electronic element of the pick up apparatus, a light emitting element (semiconductor laser element or laser chip, for example) for emitting output light and a light receiving element (photo IC, for example) for receiving incident light are included.

Although not specifically described in detail in Embodiment 1 to 4, the bottom portion for positioning the adhesive is provided with the tapered section interposed therebetween, on the further outer circumference side of the spacer section, so that the spacer sections are in direct contact with each other vertically without the adhesive interposed therebetween. As a result, it becomes possible to achieve the objective of the present invention to stabilize the overall thickness of the module and suitably maintain the optical characteristics.

As described above, the present invention is exemplified by the use of its preferred Embodiments 1 to 5. However, the present invention should not be interpreted solely based on Embodiments 1 to 5 described above. It is understood that the scope of the present invention should be interpreted solely based on the claims. It is also understood that those skilled in the art can implement equivalent scope of technology, based on the description of the present invention and common knowledge from the description of the detailed preferred Embodiments 1 to 5 of the present invention. Furthermore, it is understood that any patent, any patent application and any references cited in the present specification should be incorporated by reference in the present specification in the same manner as the contents are specifically described therein.

Industrial Applicability

The present invention can be applied in the field of an optical element such as a lens and an optical function element; an optical element module such as a plurality of lenses and a plurality of optical function elements; an optical element wafer provided with a plurality of optical elements, such as a plurality of lenses and a plurality of optical function elements, in a wafer state; an optical element wafer module in which the plurality of optical element wafers are laminated; a method for manufacturing the optical element module, which is made by cutting the optical element wafer or the optical element wafer module; an electronic element wafer module in which the optical element wafer or optical element wafer module is modularized with an electronic element wafer; a method for manufacturing an electronic element module, in which the electronic element wafer module is cut simultaneously; an electronic element module manufactured by the method for manufacturing the electronic element module; and an electronic information device, such as a digital camera (e.g., a digital video camera or a digital still camera), an image input camera, a scanner, a facsimile machine, a camera-equipped cell phone device and a television telephone device, including the electronic element module used therein. According to the present invention with the structure described above, the adhesive is provided only in the space portion surrounded by the bottom portion provided with the tapered section interposed therebetween on the further outer circumference side of the planarized surface of the spacer section of the optical element, but the adhesive is at least not provided in the space portion made by the tapered section. When adhering, a space large enough for the adhesive to be pressed and spread is provided at least by the space portion made by the tapered section. As a result, since the overall thickness is not negatively influenced due to the interposition of the adhesive, which is negatively influenced conventionally, the lens space or the space between the lens and the image capturing element will be stabilized without variations therebetween, and the optical characteristics will be suitable. Furthermore, since there is no change from the conventional cutting process, the manufacturing cost can remain low.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A plurality of optical elements, comprising:
an upper optical element; and
a lower optical element;
wherein the upper optical element and the lower optical element each comprises an optical surface at a center portion thereof, and a spacer section having a predetermined thickness on an outer circumference side of the optical surface,
wherein upper and lower bottom portions for positioning an adhesive are provided on a further outer circumference side of the respective planarized surfaces of the spacer section of the upper optical element and the spacer section of the lower optical element with tapered portions interposed between the spacer sections and the bottom portions,
wherein the adhesive is positioned in a space portion surrounded by the upper and lower bottom portions, so that the upper optical element and the lower optical element are adhered to each other, and wherein a gap is formed by the tapered portions as an extra space for the space portion.

2. A plurality of optical elements according to claim 1, wherein a surface height of the spacer section is configured to be higher than a surface height of the respective optical surface, and the spacer section is connected to the respective optical surface with an inclined surface interposed therebetween.

3. A plurality of optical elements according to claim 1, wherein the spacer section is provided for the optical surface.

4. A plurality of optical elements according to claim 1, wherein the spacer section is a protruded portion or a planarized portion, which is protruded further than a convex shape of the respective optical surface, surrounding the optical surface from an outer circumference end portion of the optical surface with an inclined surface interposed therebetween.

5. A plurality of optical elements according to claim 4, wherein the protruded portion is annularly protruded, or is protruded as part of the annular shape, more than the convex shape of the optical surface, from the outer circumference end portion of the optical surface with the inclined surface interposed therebetween.

6. A plurality of optical elements according to claim 1, wherein when a securing tape is adhered on the spacer section to cover an upper part thereof during individual cutting, a surface height of the spacer section is configured to be higher than a surface height of the respective optical surface so that the securing tape does not adhere on the optical surface.

7. A plurality of optical elements according to claim 2, wherein when a securing tape is adhered on the spacer section to cover an upper part thereof during individual cutting, the surface height of the spacer section is configured to be higher than the surface height of the respective optical surface so that the securing tape does not adhere on the optical surface.

8. A plurality of optical elements according to claim 2, wherein the optical surface and a protruded portion or planarized portion, which is more protruded than the optical surface, are provided on either a front surface or a back surface of the optical element.

9. A plurality of optical elements according to claim 5, wherein a part or all of a top surface of the annular protruded portion includes a planarized surface.

10. A plurality of optical elements according to claim 2, wherein a difference between the surface height of the spacer section and the surface height of the optical surface is between 20 μm and 100 μm.

11. A plurality of optical elements according to claim 2, wherein a difference between the surface height of the spacer section and the surface height of the optical surface is 50 μplus or minus 10 μm.

12. A plurality of optical elements according to claim 1, wherein the optical surface and the spacer section are simultaneously formed with a transparent resin material.

13. A plurality of optical elements according to claim 1, wherein the optical element is a lens.

14. A plurality of optical elements according to claim 1, wherein the optical element is an optical function element for directing output light straight to be output and refracting and guiding incident light in a predetermined direction.

15. A plurality of optical elements according to claim 1, wherein the optical surface is a circle with a diameter of 1 mm plus or minus 0.5 mm.

16. An optical element wafer in which the plurality of optical elements according to claim 1 are simultaneously formed and arranged in two dimensions.

17. An optical element wafer module in which the plurality of optical element wafers according to claim 16 are laminated by aligning the optical surfaces thereof.

* * * * *